United States Patent
Collins

(10) Patent No.: US 6,393,685 B1
(45) Date of Patent: *May 28, 2002

(54) MICROJOINERY METHODS AND DEVICES

(75) Inventor: Scott D. Collins, Davis, CA (US)

(73) Assignee: The Regents of the University of California, Oakland, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/095,417

(22) Filed: Jun. 9, 1998

Related U.S. Application Data

(60) Provisional application No. 60/049,151, filed on Jun. 10, 1997.

(51) Int. Cl.[7] .................................................. B81C 3/00
(52) U.S. Cl. ............................ 29/416; 29/428; 29/434; 216/2; 216/36; 216/74; 216/75; 216/99; 403/345; 156/257
(58) Field of Search ................................ 216/2, 74, 75, 216/99, 36; 403/345; 29/416, 428, 434; 156/257

(56) References Cited

U.S. PATENT DOCUMENTS

| | | | |
|---|---|---|---|
| 4,612,554 A | * | 9/1986 | Poleshuk ..................... 347/63 |
| 4,929,301 A | | 5/1990 | Beechko |
| 4,962,062 A | * | 10/1990 | Uchiyama .................. 438/456 |
| 5,025,346 A | | 6/1991 | Tang et al. |
| 5,029,805 A | | 7/1991 | Albarda et al. |
| 5,161,774 A | | 11/1992 | Engelsdorf et al. |
| 5,176,358 A | | 1/1993 | Bonne et al. |
| 5,180,623 A | | 1/1993 | Ohnstein |
| 5,197,517 A | | 3/1993 | Perea |
| 5,238,223 A | | 8/1993 | Mettner et al. |
| 5,254,209 A | | 10/1993 | Schmidt et al. |
| 5,309,943 A | | 5/1994 | Stevenson et al. |
| 5,314,575 A | | 5/1994 | Yanagida |
| 5,322,258 A | | 6/1994 | Bosch et al. |
| 5,333,831 A | | 8/1994 | Barth et al. |
| 5,364,742 A | | 11/1994 | Fan et al. |
| 5,417,235 A | | 5/1995 | Wise et al. |

(List continued on next page.)

OTHER PUBLICATIONS

Webster's New Collegiate Dictonary, Merriam–Webster, Springfield Mass, pages 740, 1975.*
Webster's New World Dictionary, Pocket Books Paperback Ed., Simon & Shuster, New York, 1995.*
Fujikawa et al., "Fabrication of Comb–Shaped Microactuator for Multi–Degrees–of–Freedom System", IEEE 1992, pp. 990–995.
Han, et al, "Micromechanical Velcro", Journal of Microelectromechanical Systems, vol. 1, No. 1, Mar. 1992, pp. 37 43.*

*Primary Examiner*—Richard Bueker
(74) *Attorney, Agent, or Firm*—John P. O'Banion

(57) ABSTRACT

A wafer level interconnecting mechanism for assembling and packaging multiple MEMS devices (modules), using microfabricated, interlocking, mechanical joints to interconnect different modules and to create miniature devices. Various devices can be fabricated using these joints, including fiber-optic switches, xyz translational stages, push-n-lock locking mechanisms, slide-n-lock locking mechanisms, t-locking joints, fluidic interconnects, on/off valves, optical fiber couplers with xy adjustments, specimen holders, and membrane stops.

12 Claims, 30 Drawing Sheets

U.S. PATENT DOCUMENTS

| | | | | |
|---|---|---|---|---|
| 5,530,342 A | | 6/1996 | Murphy | |
| 5,649,423 A | * | 7/1997 | Sniegowski | 60/531 |
| 5,676,850 A | * | 10/1997 | Reed | 216/2 |
| 5,772,902 A | * | 6/1998 | Reed | 216/2 |
| 5,787,976 A | * | 8/1998 | Hamburgen | 165/185 |
| 5,801,452 A | * | 9/1998 | Farnworth | 257/797 |
| 5,804,314 A | * | 9/1998 | Field et al. | 428/402 |
| 5,814,885 A | * | 9/1998 | Pogge et al. | 257/730 |
| 5,849,204 A | * | 12/1998 | Matsumoto | 216/2 |
| 5,866,443 A | * | 2/1999 | Pogge | 438/110 |
| 5,949,850 A | * | 9/1999 | Tang | 378/154 |
| 5,956,575 A | * | 9/1999 | Bertin et al. | 438/110 |
| 5,976,390 A | * | 11/1999 | Maramatsu | 216/2 |
| 6,025,638 A | * | 2/2000 | Pogge et al. | 257/618 |

* cited by examiner

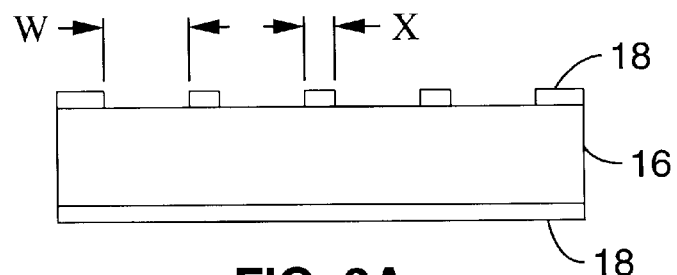
FIG. 3A
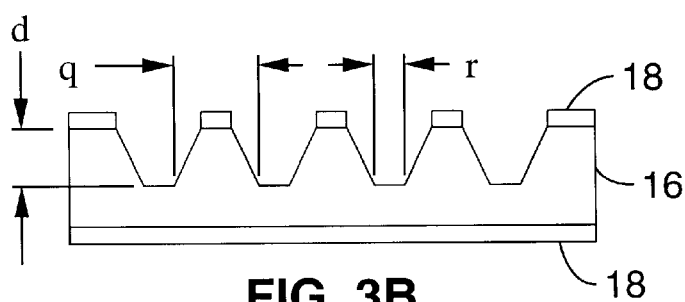
FIG. 3B
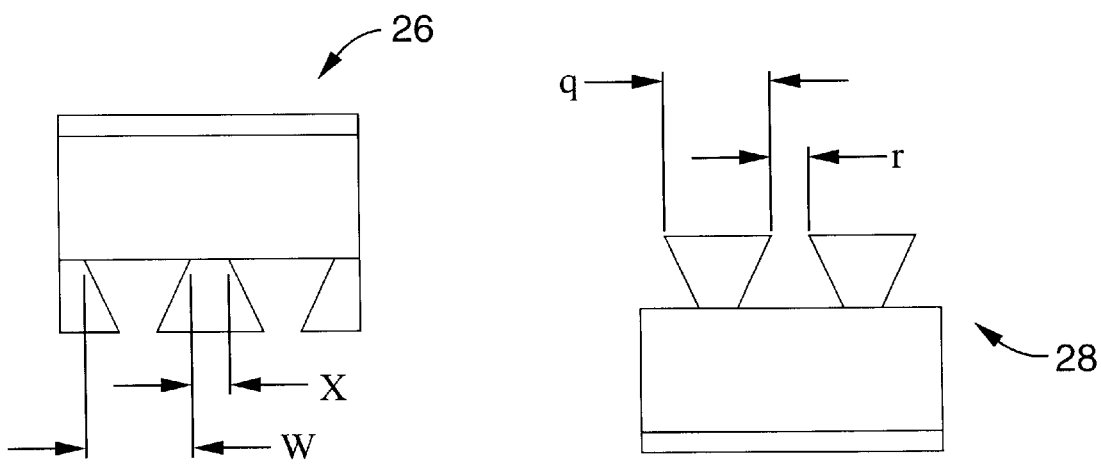
FIG. 3C     FIG. 3D

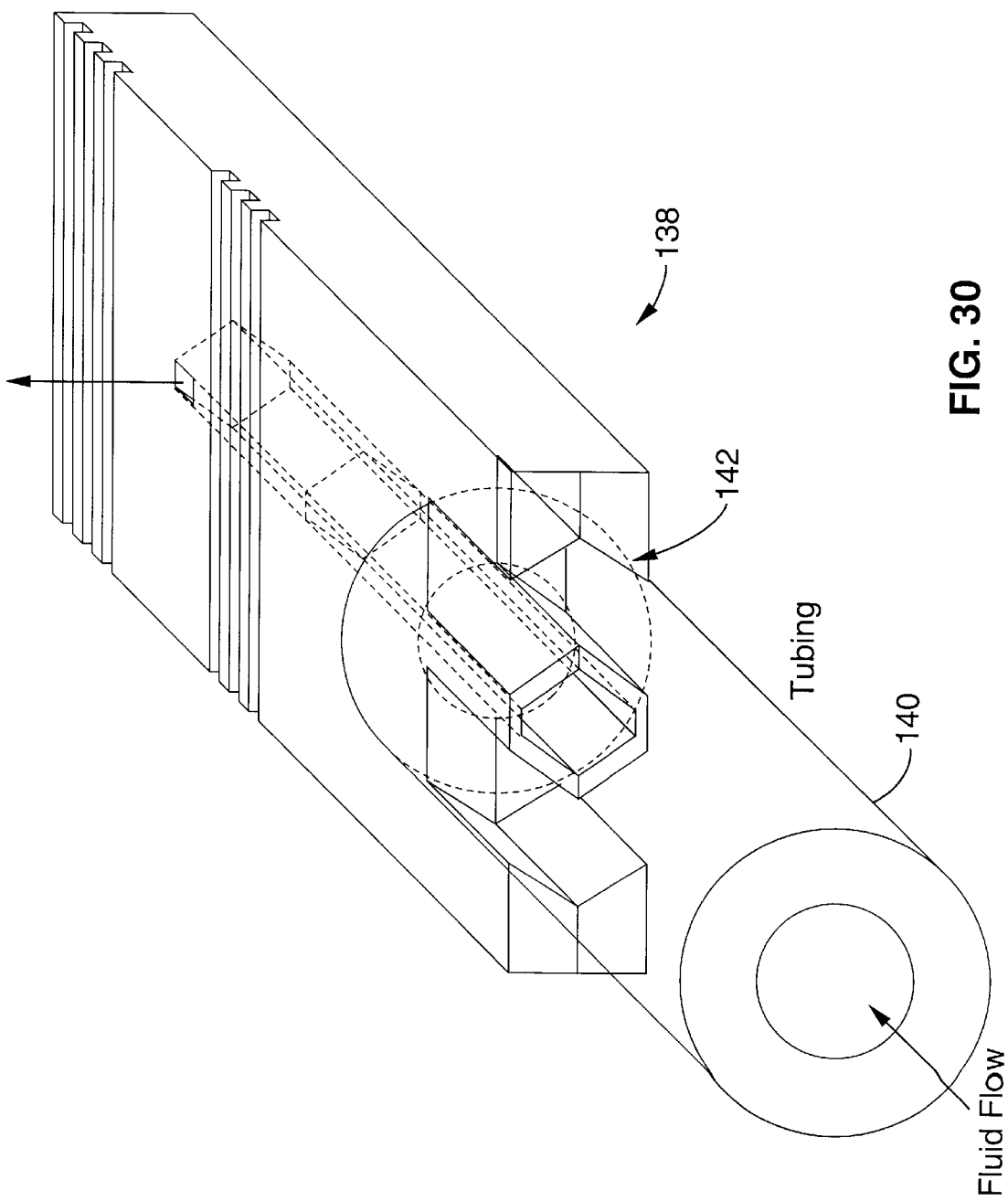

MICROJOINERY METHODS AND DEVICES

CROSS-REFERENCE TO RELATED APPLICATIONS

This application claims priority from U.S. provisional application Ser. No. 60/049,151 filed on Jun. 10, 1997, which is incorporated herein by reference.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention pertains generally to devices and methods for interfacing, interconnecting and assembling a network of individual MEMS modules (i.e. microfluidic pumps and valves, miniature reaction chambers, optical detection schemes, CMOS control circuitry, etc.) for creating integrated miniature instruments, and more particularly to miniature devices and methods for constructing those devices in a microscopic environment which allows the manufacture of miniature high precision devices such as fiber optic switches, xyz translational optical benches and other devices on a microscopic scale.

2. Description of the Background Art

Microfabrication is a generic term for a rather large, eclectic, and sophisticated collection of different processing techniques. It is both a powerful and versatile technology which enjoys a well respected history in the fabrication of high density, high precision integrated electronics, LED's, solid state lasers, and optical detectors. The recent explosion in the field of optical communications, imaging, optical signal processing, and optical recording has fueled a focused search for reliable, compact, inexpensive, and low loss ancillary micro-accessories to augment functionality in expanding optical Microsystems. Foremost in the search for micro-accessories has been the application of surface micromachining to the fabrication of optical and mechanical microcomponents.

Surface micromachining was introduced in the late 1960s as a technology for the generation of elegant and moveable micromechanical components such as micro-gears, tongs, cams, and including a micromotor the diameter of a human hair. However, surface micromachining is inherently limited in its application because it provides only a limited range of motion for the mechanical components (a few hundred micrometers at best) as well as a particularly planar geometry which does not lend itself to three dimensional device construction. For example, fiber optic communication lines are approximately 125 micrometers in diameter, and therefore, physical fiber optic switches can require much more than microns of translation to effect switching between fiber optic lines.

Furthermore, systems integration of microfabricated components has recently blossomed into a critically emerging field of interest in today's microfabrication environment. Already, a literal zoo of revolutionary microdevices has appeared in the literature, generating such futuristic speculations as nano-robots and micro flying machines. Toyota has even fabricated a microcar powered by magnetic induction and Seiko has demonstrated a microlathe capable of turning a 40 micrometer needle tip. Although such interesting creations entice the imagination, practical Microsystems have yet to realize their full commercial potential, due mostly to stubborn technical limitations in present microfabrication technologies and techniques.

Despite the plethora of micromachined components reported in the literature to date, micromachines in general have recently come under strong criticism for promising much but delivering little. Generally, there is a growing sentiment that micromachining is more of an esoteric laboratory curiosity than a practical commercial commodity. For this reason, commercial and industrial concerns are backing off their initial excitement with the microworld and concentrating on more immediate products.

At least a portion of micromachining's perceived lackluster performance in microelectromechanical systems (MEMS) stems from a genuine limitation in the way the technology has developed. As it stands today, micromachining is a rather diverse collection of disjointed and inherently incompatible techniques. Although each particular micromachining technique is ideally suited to fabricate certain, very specific, types of microdevices, no one technology is capable of optimally fabricating all microstructures, nor can different micromachining techniques be 'mixed and matched' to fill in the missing components. Once a basic fabrication process is started, fundamental process incompatibilities dictate that it cannot be altered despite the fact that some of the required components may best be fabricated by other means. This translates into less than optimal performance for even the simplest microdevice, and a complete disaster for complex Microsystems requiring a broad spectrum of interconnected microdevices. For this reason, the most successful micromachined devices on the market today are relatively simple straightforward projects focusing on one specific micromachining technique.

The problem is best illustrated by the recent attempts to create integrated free-space microphotonics systems: the so-called optical bench on a chip. Up to now, development of micro-optical systems has been divided between monolithic guided-wave approach, in which passive and/or electro-optic control networks route optical beams through planar waveguides and free-space microphotonic systems. Although the waveguide approach has enjoyed a modest degree of success, the method is rather limited in scope and potential application. Optical benches are now considerably more versatile, but require mechanical components to steer, align, scan, or otherwise manipulate optical beams. In the past, surface micromachining processes were the most widely used for construction of optical and mechanical microcomponents.

Ironically, integration, a touted advantage of surface micromachining, has also been a major impediment in its successful commercialization. Although surface micromachining is an extremely elegant method for the monolithic integration of many micro-opto-mechanical components, unless all necessary components in a microsystem are microfabricated with a virtual 100% yield, integration loses much, if not all, of its appeal. Unfortunately, surface micromachining's spectrum of available microstructures is insufficient to complete a truly functional microsystem. Input/output has been particularly troublesome for surface-micromachined optics and MEMS in general.

For example, most reports on surface-micromachined integrated optical systems usually show the optical source, III-V laser or LED, "hand glued" to an otherwise integrated silicon chip, the reason being that III-V semiconductor processing is inherently incompatible with silicon surface micromachining. Such crude and inaccurate hand assembly/alignment does little justice to the elegant precision available to micromachining.

A significant problem in the microfabrication of complicated systems is that different system components are process incompatible, i.e. the fabrication of one device destroys or impedes the fabrication of another critical component. Therefore, it is advantageous to microfabricate each component separately, using proven techniques and processes best suited for each component, then assemble them in the end to form the completed microsystem. This is a module, or hybrid, approach, and eliminates the issue of process incompatibility. However, to accomplish this, a means to interconnect modules and/or components is required.

Although each micromachining technology by itself may be limited in its range of performance, all micromachining technologies, when considered as a collective unit, generally span the entire spectrum of requisite microdevices. What is desperately needed to make commercially viable microsystems is a unifying micromachining technology which marries this already existing, but rather eclectic, collection of microdevices and micromachining technologies. The concept is not unlike the complimentary synergism between hybrid and integrated electronics, i.e., even though integrated electronic circuits are fast, powerful, and small, without the means to interconnect them to each other, discrete components, and the external world through the use of PC boards, thick-film technology, etc., they are completely useless. As it stands today, micromachining lacks an analogous cohesive inter-connect technology, making any concerted leap into micro-systems "difficult" at best.

BRIEF SUMMARY OF THE INVENTION

The present invention, which will be referred to herein as "MicroJoinery", pertains to a wafer level interconnecting mechanism for assembling and packaging multiple MEMS devices (modules). This new technology allows for both integrating and packaging multiple MEMS modules to form miniature systems and devices. The present invention provides a method for the interconnection and/or assembly of microcomponents to facilitate the conduction of fluidic, electrical and optical signals from one module to another, thereby allowing the assembly of several modules to produce a total microsystem. This technology allows the performance of each component, and the yield of an entire system, to be maximized, translating to a low, per unit, cost.

The present invention generally comprises a novel wafer level interconnecting mechanism for assembling and packaging multiple miniature devices (modules). The joining structures will facilitate the modular placement and self-alignment of each module to each other, or on a single substrate, by locking them into position, thereby significantly simplifying the manufacturing process. The nature of these MicroJoinery structures also allows each module to be logically interchanged to alter the operation and/or function of an entire unit.

MicroJoinery is a hybrid technology which successfully addresses the interface between the many diverse and sometimes mutually exclusive micro-machining techniques. Although this approach appears problematic at first, MicroJoinery makes it a tangible reality and is quickly developing into an indispensable technology that binds all micromachining techniques into a single cohesive unit: bulk micromachining, surface micromachining, LIGA, etc. By using MicroJoinery, discrete microcomponents may be fabricated separately using the micromachining technology most optimal for the function of that particular component and later assembled, interfaced, and/or otherwise aligned within a microsystem in a completely hybrid fashion. This critical feature of MicroJoinery relieves much of the growing pressure to "integrate fully" an unreasonable expectation to begin with, and provides the necessary technical base to launch MEMS into a practical commercial reality.

By way of example, and not of limitation, the invention generally comprises microfabricated, interlocking, mechanical joints to interconnect different modules and to create miniature devices, as well as a method for fabricating those joints. The invention further comprises a method for the fabrication of MicroJoints in the form of dovetail joints, dado joints, rotary joints, lock and finger joints, and the like, which are then used in the assembly of various microsystems. The joints are micromachined using standard, non standard, and new microfabrication techniques. Various devices can be fabricated using these joints, including fiber-optic switches, xyz translational stages, push-n-lock locking mechanisms, slide-n-lock locking mechanisms, t-locking joints, fluidic interconnects, on/off valves, optical fiber couplers with xy adjustments, specimen holders, and membrane stops. Several of the these devices are fabricated with interlocking "dovetail" and "dado" joints. For example, an xyz translational stage could incorporate interlocking "dovetail" joints and a "dado" joint for mounting a vertical mirror. The dimensions of the device can be as small as several ten's of microns or as large as many centimeters.

The joints can be created through various techniques, including microsawing and micromilling, although a preferred method is anisotropic etching. Furthermore, many different materials can be used, such as Ge, GaAs, quartz, etc., but (100) oriented silicon is particularly well suited to creating dovetail joints through an anisotropic etching process. Starting with bare (100) silicon wafers, an etch masking material such as LPCVD silicon nitride, silicon dioxide, or other suitable masking materials is deposited and appropriately patterned using conventional photolithography and chemical etching techniques to expose the underlying silicon. The patterned wafer is then placed in an anisotropic silicon etchant such as KOH, and etched to the designed depth. After the desired depth is reached, the etched wafer is bonded to a virgin silicon wafer using standard silicon wafer bonding techniques. A passivation layer is then deposited over the bonded wafer. The wafer is then mechanically polished or etched to thin it and expose the dovetail joints. At this point the dovetail structures are complete and the wafer is diced using a conventional wafer dicing saw in such a way to have both the "negative" and "positive" dovetail structures, although individual pieces could be fabricated on separate wafers. After dicing, the opposite pieces can be joined by sliding them into each other.

Dado joints can be fabricated from the anisotropic etching of (110) or off axis etching of (100) silicon, by cutting the material using a conventional dicing saws, by micromilling or any combination of these or other techniques. Dado joints are particularly well adapted for bonding portions of material at a perpendicular orientation. Rabbet joints are a slight variation of the dado joint, and may also be fabricated using similar techniques.

Borrowing from woodworking nomenclature, any number of other joints in addition to dovetail, dado and rabbet joints may be recruited into the microlevel including: lock joints, finger joints, mortise and tenon joints, etc. These MicroJoints can be used to create and assemble virtually any desired microsystem through a number of conventional and non conventional methods available to microfabrication including: wafer sawing, micromilling, electrical discharge, electrochemical depositions/etching, molding, LIGA or LIGA-like processes, thick film processes, surface micromachining, wafer bonding methods, or others.

An object of the invention is to provide a method for fabricating integrated miniature instruments capable of much larger gross movements than that afforded by past surface micromachining processes.

Another object of the invention is to provide a means for constructing viable optical switches and couplers capable of handling multiple inputs and outputs.

Another object of this invention is to provide a means for constructing miniature xyz translational optical benches.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only, where like reference numbers denote like parts:

FIG. 3(a) through FIG. 3(d) show the relationships of the dimensional criteria of dovetail MicroJoints in accordance with the present invention.

FIG. 30 is a perspective diagrammatic view of an alternative embodiment of the tenon MicroJoint shown in FIG. 29 fitted to a tubing.

DETAILED DESCRIPTION OF THE INVENTION

In its simplest definition, MicroJoinery in accordance with the present invention comprises the fabrication and assembly of MicroJoints to realize three-dimensional microstructures. Each MicroJoint contains two or more mating surfaces which join the various pieces together as a single unit, hence, the appellation "MicroJoinery". The intended function of the joint may be to fix the individual parts rigidly together, or the joints may merely constrain movement between the individual parts. For those versed in classical machining and assembly techniques, joinery is a familiar concept used daily in the construction of a wide variety of complex macromechanical parts. However, MicroJoinery transcends these simple origins and applies joinery at the microscale to realize completely new microstructures and radically new methods to assemble those microstructures into viable Microsystems. Scaling for size, the geometry and intended function of the various MicroJoints are usually similar to their larger macro counterparts. However, the methods used to fabricate macro and microjoints diverge considerably; there are, literally, no chisels or hammers available in the micro-fabrication "toolbox" of the present invention.

When considering the following description of the invention, it will be appreciated by those skilled in the art that a comprehensive inclusion of all possible MicroJoints along with all possible means to fabricate those MicroJoints would be prohibitive as well as unnecessary. The invention as described herein presents the foundation MicroJoinery as a viable methodology for the creation of a diverse collection of practical and unique microstructures. Adaptation to specific microsystems will be delegated to the individual researcher.

Figure 1:
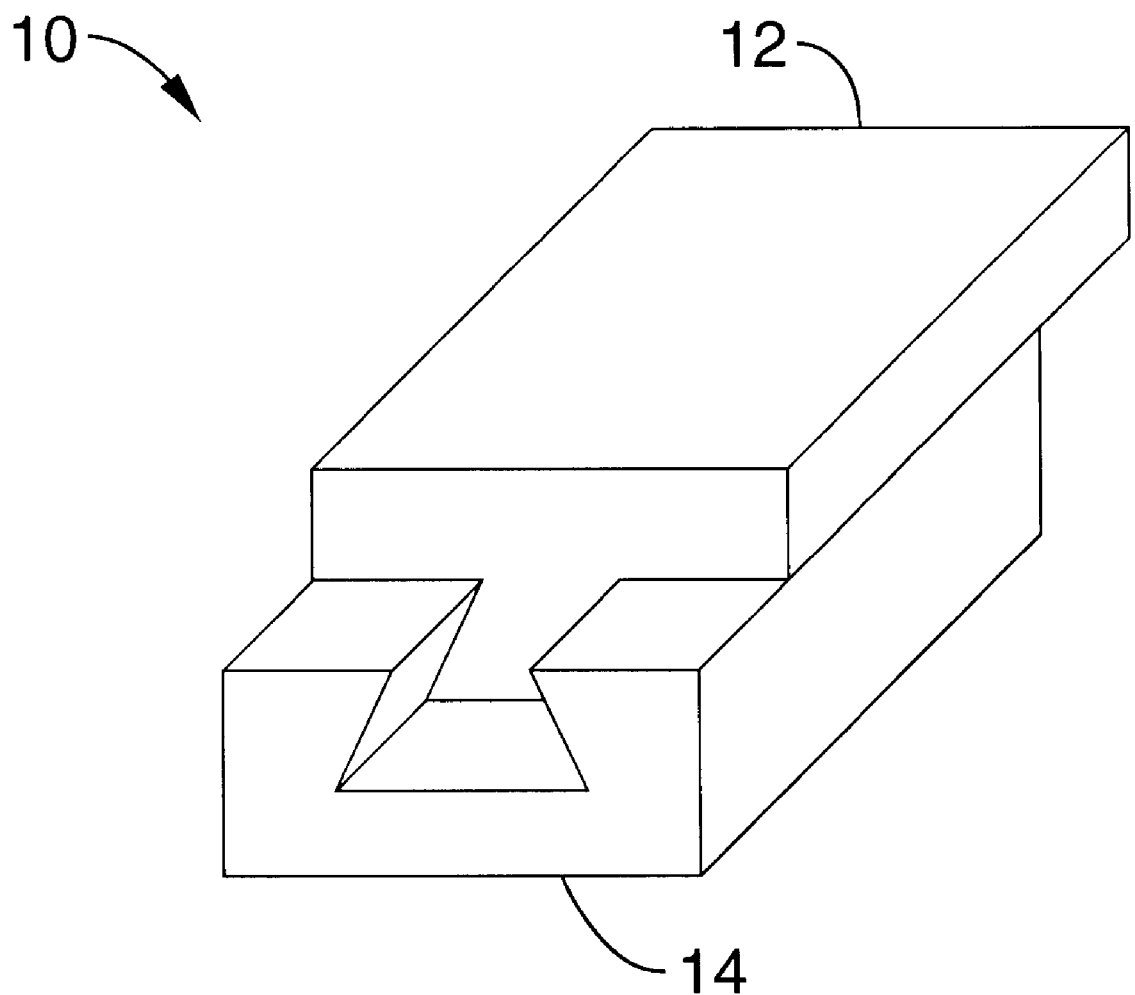
FIG. 1 is a perspective view of a dovetail MicroJoint in accordance with the present invention.

One of the most versatile MicroJoints fabricated to date is a dovetail MicroJoint 10 as shown in FIG. 1, which comprises positive 12 and negative 14 interlocking members. Dovetail joints are pedestrian components found on most optical, biological, and fine-tooling benches. They are commonly used in xyz positioning stages, micropositioners, alignment stages, and other devices that require constrained linear translation. Microfabrication of the dovetail joint allows all these macro devices, along with the specific functions that they perform, to be realized at the micro level.

Figure 2:
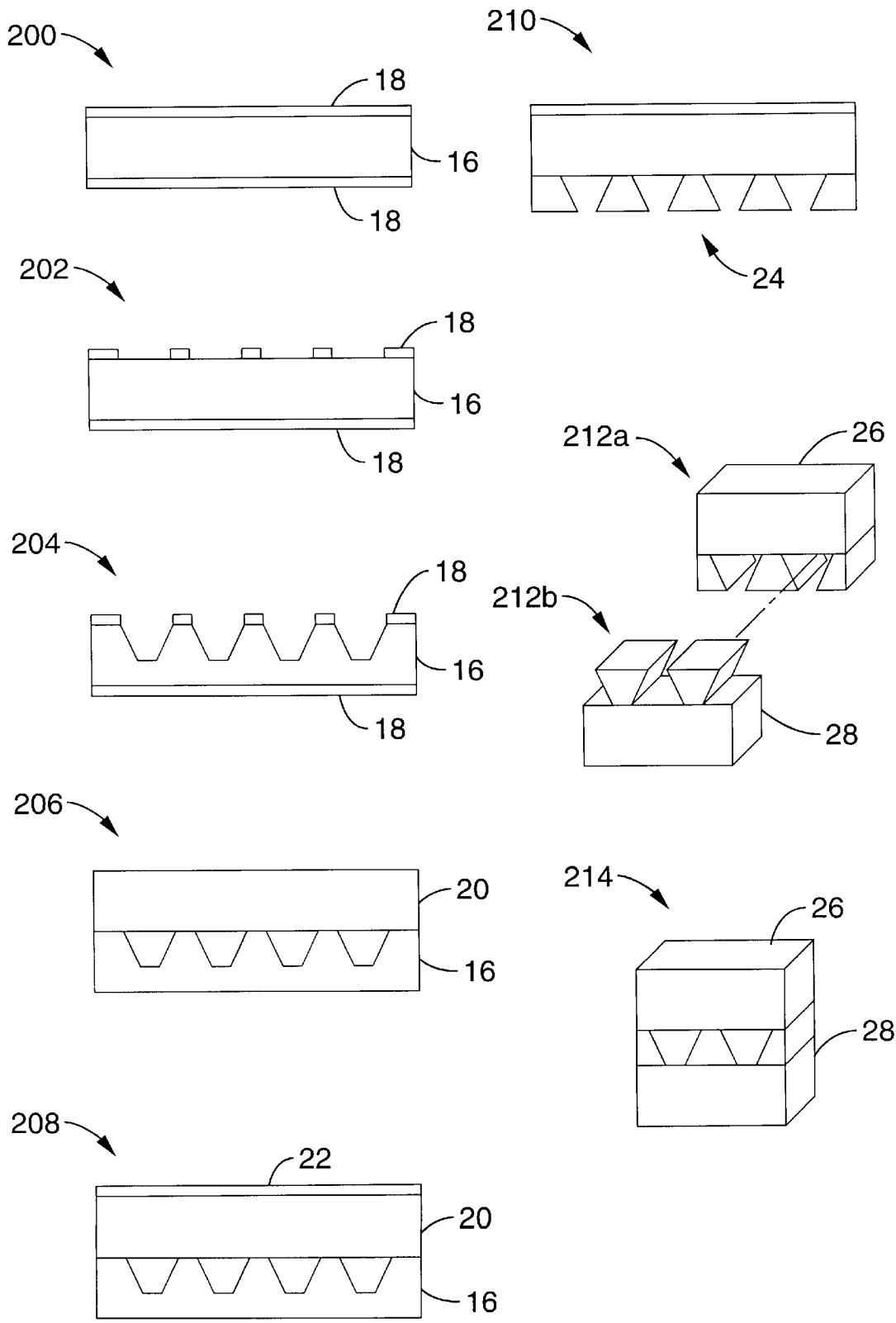
FIG. 2 is a process flow diagram showing the steps of a process for creating dovetail MicroJoints in accordance with the present invention.

Referring to FIG. 2 through FIG. 4, the steps for creating a dovetail joint in accordance with the present invention are generally shown. Preferably, the desired shapes are formed in (100) single crystal silicon wafers through anisotropic etching. Although (100) oriented silicon is used to describe the fabrication process, virtually any anisotropic etched material or crystal orientation can be used (i.e. Ge, GaAs, quartz, etc.).

As shown in FIG. 2, starting with bare (100) silicon wafers 16 at step 200, an etch masking material 18 such as LPCVD silicon nitride, silicon dioxide, or other suitable masking material is deposited on the silicon wafer 16, and appropriately patterned at step 202 using conventional photolithography and chemical etching techniques to expose the underlying silicon. At step 204, the patterned wafer then placed in an anisotropic silicon etchant such as KOH, and etched to the designed depth. A 10–80% KOH solution at 40–80° C. may be used as an etchant, however a 45% KOH solution at 60° C. is preferred. Using this method for etching, the silicon dissolution occurs rapidly in all crystallographic directions except the (111) direction. The result is an etch structure that is defined by a unique collection of (111) crystallographic planes. After the desired depth is reached, the masking material is stripped, and the etched wafer is bonded to a virgin silicon wafer 20 using silicon wafer bonding techniques at step 206. A passivation layer 22 is then deposited over the bonded wafers at step 208. At step 210, the etched wafer is then mechanically lapped or further etched in KOH to thin it and expose the dovetail joints 24. At this point the dovetail structures are complete and the wafer is diced at steps 212a and 212b using a conventional wafer dicing saw. The wafer is diced in such a way to have both the "negative" 26 and "positive" 28 dovetail structures, although individual pieces could be fabricated on separate wafers. After dicing, the opposite pieces can be joined by sliding them into each other at step 214.

Although almost any single crystalline material such as quartz, GaAs, or Ge, of virtually any crystal orientation could be used, crystallographic etch geometries of (100) silicon are ideal because the (111) planes form an angle of 54.7° with the surface in (100) silicon. It will also be appreciated that, in addition to etching, the joints could be fabricated by cutting the material using conventional dicing saws, by micromilling the material or any combination of these or other like techniques. Additionally, the joints may serve as replication molds for other non-crystalline materials.

The MicroJoint tolerances are ultimately determined by both mask design and the precision of anisotropic etching. The dimensional criteria for fabricating a dovetail structure in (100) silicon according to the method presented above is shown in FIG. 3 and FIG. 4. The width w of the windows in the silicon nitride film shown in FIG. 3(a) and FIG. 3(c) have to be equal to or larger than the base q of the etched mesa shown in FIG. 3(b) and FIG. 3(d). Likewise, the width x of the silicon nitride strip on the surface of the wafer shown in FIG. 3(a) and FIG. 3(c), has to be equal to or smaller than the spacing r between the inverted mesas shown in FIG. 3(b) and FIG. 3(d). This is all nicely accomplished by fabricating both the positive and negative structures on the same substrate, and stopping the etch before or right at the calculated depth. If separate substrates are used, alignment to (110) crystalline direction on the silicon wafer becomes important, as does the etch depth.

Figure 4A:
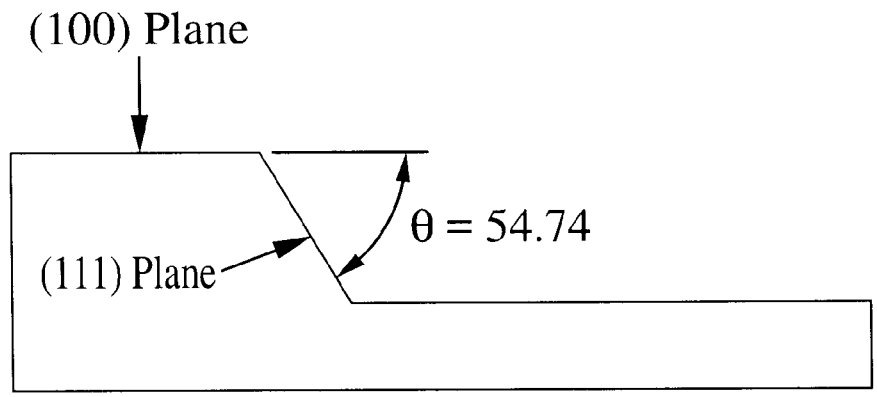
FIG. 4(a) and FIG. 4(b) show the calculations used for making a dovetail MicroJoint in (100) silicon in accordance with the present invention.
Figure 4B:
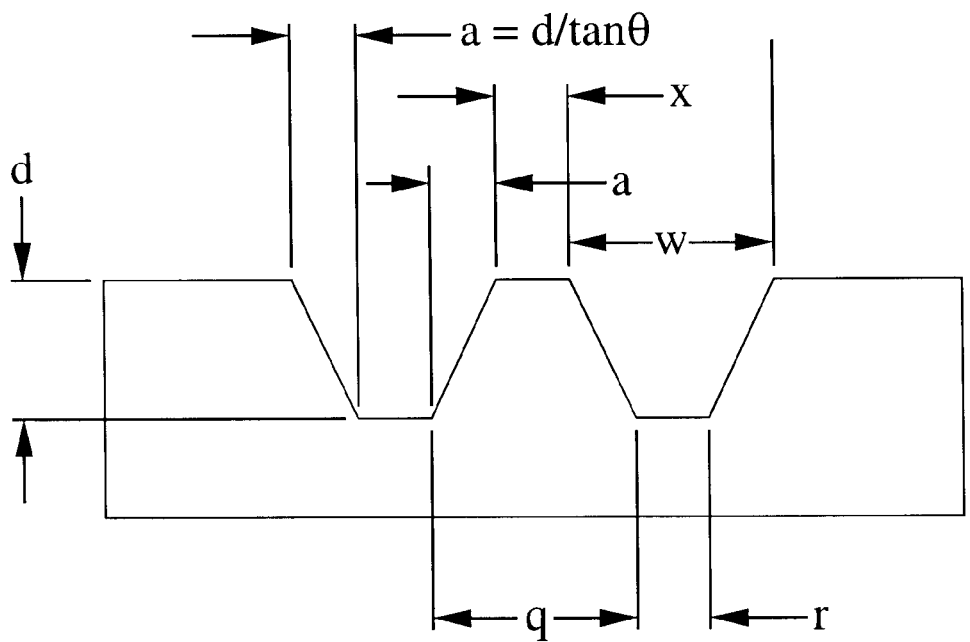

The dimensions of the mesas can be as large or as small as desired as long as the following criteria are met: q=w and r=x. This is done by satisfying the following equation as illustrated in FIG. 4(a) and FIG. 4(b):

$$w = x + \frac{2d}{\tan\theta}$$

The depth, d, of the joint is set by x, w and the anisotropic etch angle, 54.7° for (100) silicon.

$$d = \frac{w - x}{2} \tan\theta$$

Figure 5:
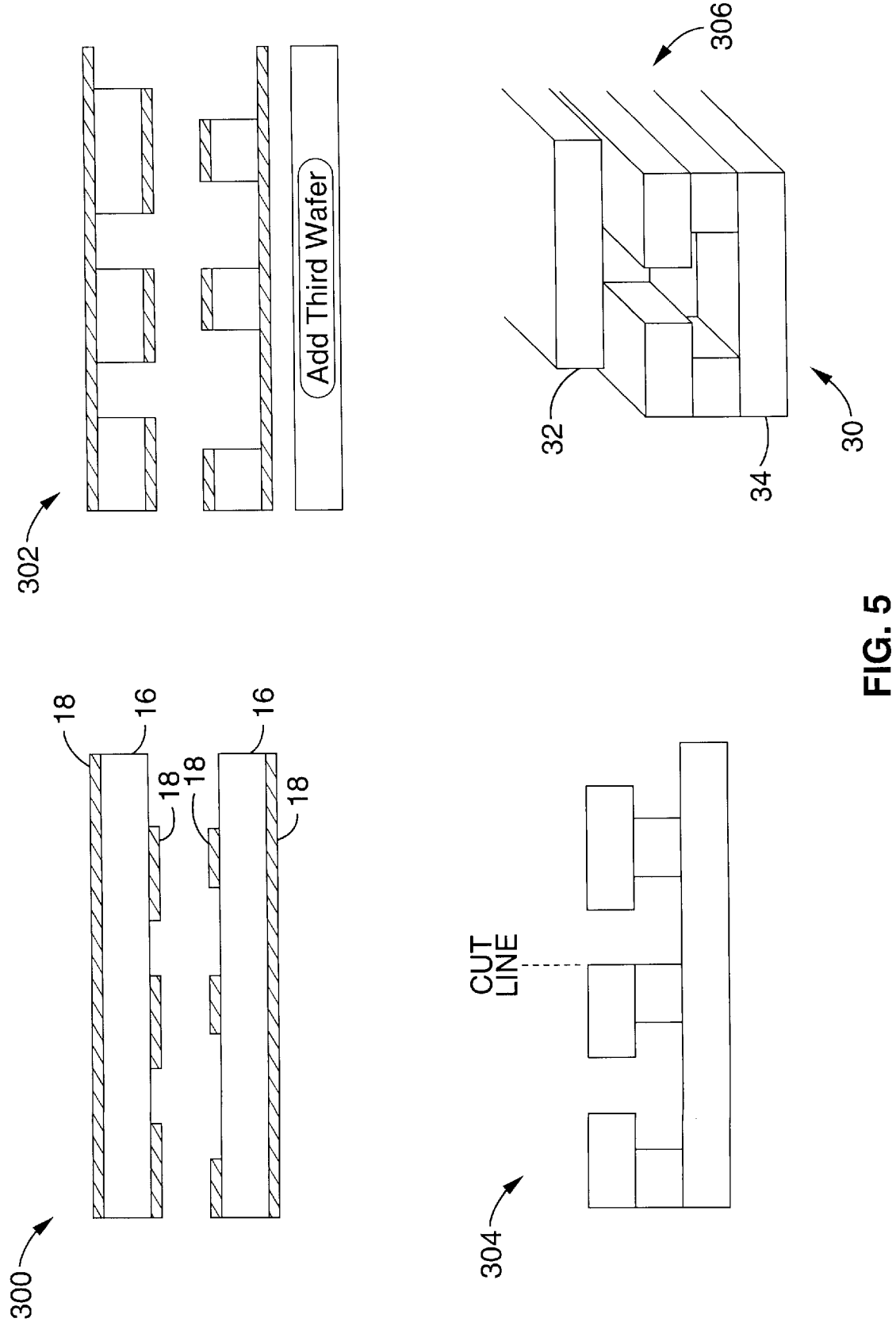
FIG. 5 is a process flow diagram showing the steps of a process for creating slot MicroJoints in accordance with the present invention.

Another useful joint is the slot joint. A slot joint is similar in function to the dovetail MicroJoint in that it also allows constrained translation, but its geometry and methods of fabrication differ slightly. It can be fabricated by any number of techniques including: micromilling, sawing, LIGA, and anisotropic etching of (110) or (100) oriented silicon wafers. FIG. 5 shows one possible fabrication process for the slot joint using anisotropic etching of (110) silicon. Two (110) silicon wafers are photolithographically patterned at step 300, and anisotropically etched at step 302 to form the various slots. A third wafer is added, and all three are fusion-bonded together at step 304, and diced. The dashed line defines where the wafer is diced to separate the two halves of the MicroJoint. At step 306 the MicroJoint is assembled to form a slot joint 30 having positive 32 and negative 34 members.

Figure 6:
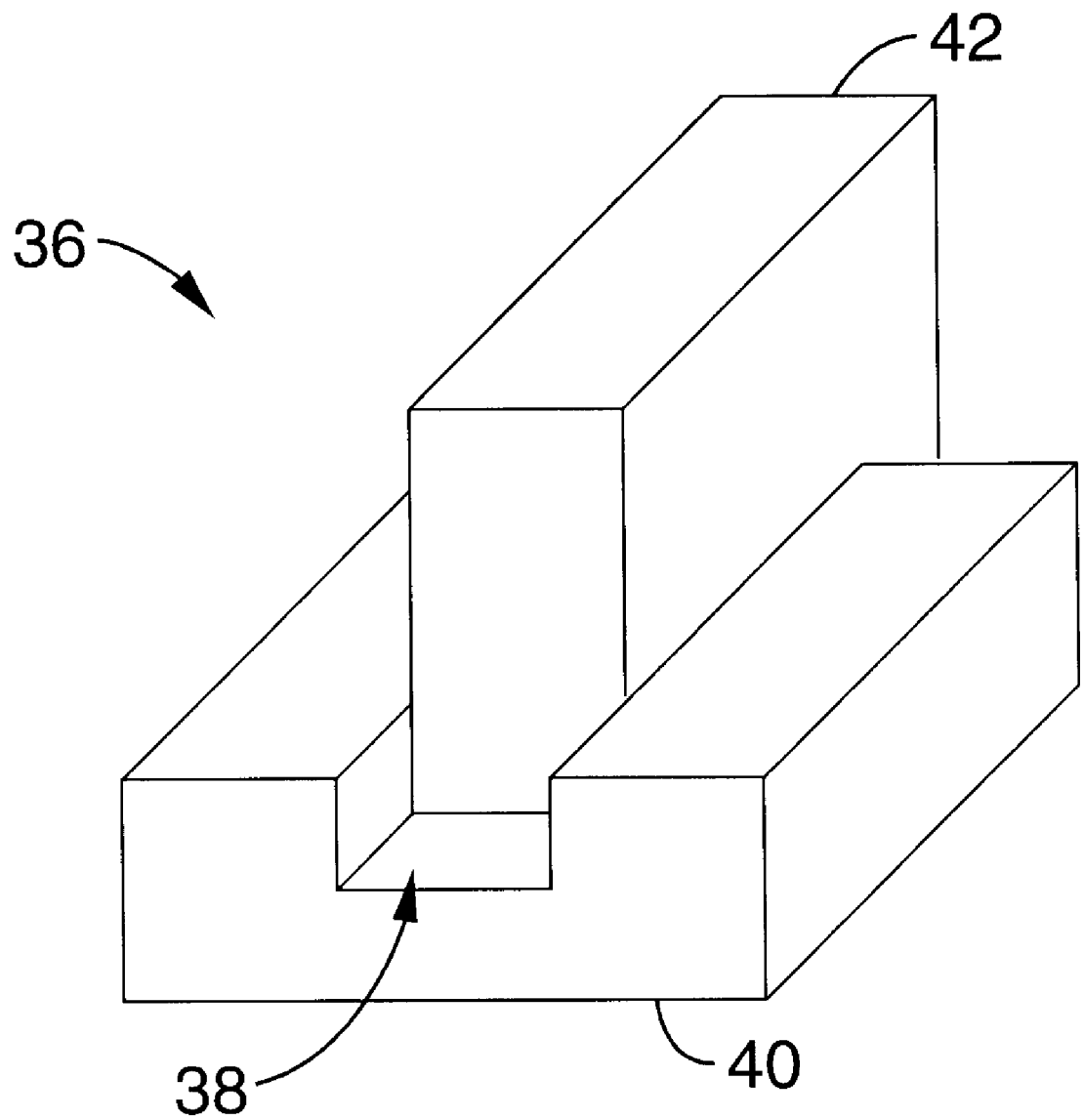
FIG. 6 is a perspective view of a dado MicroJoint in accordance with the present invention.
Figure 7A:
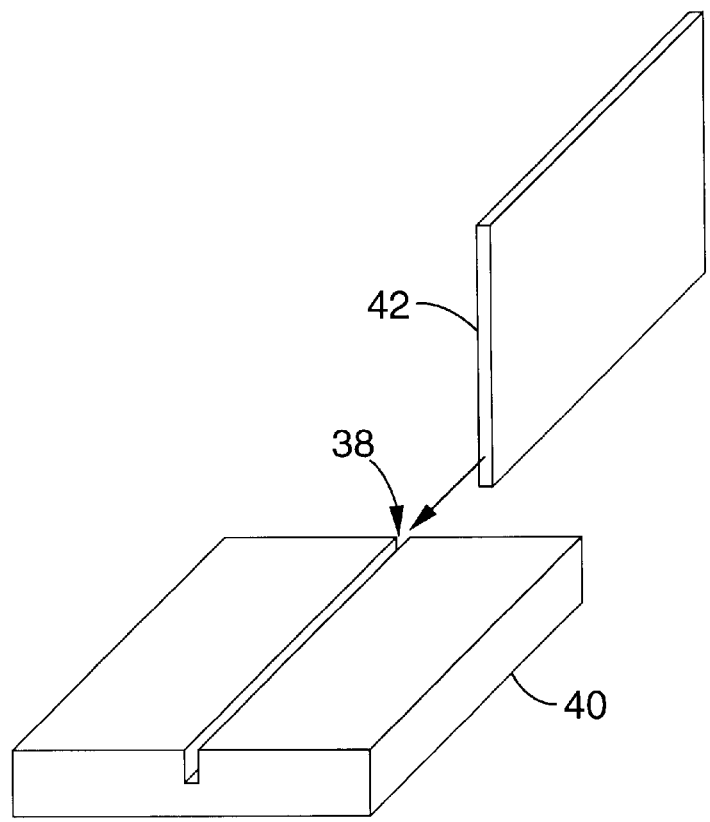
FIG. 7(a) and FIG. 7(b) are detail exploded and assembled views, respectively, of the dado MicroJoint shown in FIG. 6.
Figure 7B:
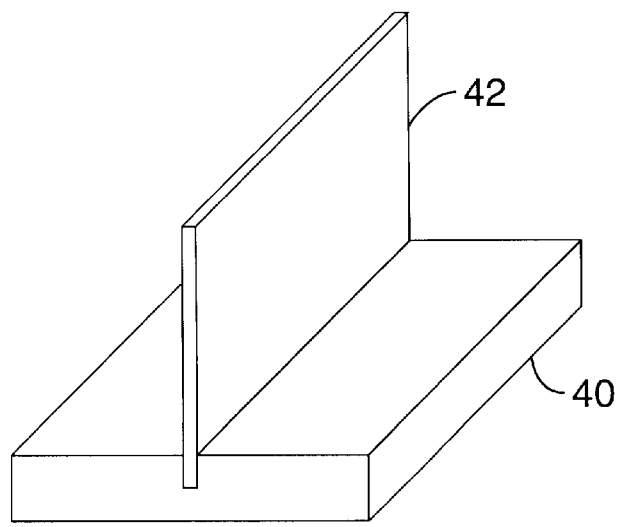

Another simple but extremely useful joint in the Micro-Joinery toolbox is the dado joint 36 shown in FIG. 6 and FIG. 7. A dado joint is simply a groove 38 fabricated in a substrate 40 into which a mating substrate 42 is fixed. When the groove is cut in the middle of the substrate, the joint is referred to as a dado joint. When the groove is located at the end of a substrate, the joint is more appropriately referred to as a rabbet joint, although dado is frequently used generically to indicate both. Uses for dado/rabbet joints vary, but are generally reserved for ridged construction of perpendicular substrates, rather than mechanical movement such as is common in the dovetail or slot MicroJoint. The dado joint may be microfabricated using: anisotropic etching of (110) or (100) silicon, cutting a groove with a dicing saw, LIGA, or micromilling. Forming high-aspect-ratio grooves through anisotropic etching of (110) silicon is a relatively straightforward process, and its methods and limitations are clearly outlined in the literature. A serious limitation of dado MicroJoints fabricated by anisotropic etching of (110) silicon is that grooves may be generated in only one direction owing to the crystallographic orientation of the (111) crystal planes. High-aspect vertical grooves may also be anisotropically etched in (100) silicon by rotation of the etch mask 45° from the normal (110) alignment. The advantage of using (100) silicon is that it allows independent sets of orthogonal grooves to be formed on the same wafer. However, the etch is not self-terminating and requires carefully timed etch-stops.

An alternative method for the formation of the dado MicroJoint which has proven both versatile and convenient is a rather old technique revisited on the micro level: sawing. Dicing saws are routinely found in the microfabrication environment, and are easily recruited to cut dado and rabbet MicroJoints with kerfs as narrow as 25 μm and depths as deep as 2 mm. Although cutting dado joints with a dicing saw lacks the extremely high precision of anisotropic etching, the ability to cut dado joints on virtually any substrate material, at virtually any angle, and at virtually any depth usually outweighs the penalties incurred from any reduction in precision.

Recently, micromilling has surfaced in the literature and shows considerable promise in defining new MicroJoints. Micromilling is, again, nothing more than the more conventional milling techniques applied at the micron level. Using diamond bits and high spindle speeds, 22 μm grooves with a minimum positive width feature of 8 μm and a maximum depth of 62 μm may be machined in a wide variety of substrates including plastics, metals, and even silicon. Unlike anisotropic etching and sawing, micromilling is not restricted to straight grooves, but is capable of arbitrary line definition; however, it does have a limited aspect ratio. The primary disadvantage of micromilling is the expense and upkeep of a delicate milling machine, and the focus Ion beam which is usually required to make diamond micromilling bits.

By combining the unique attributes of anisotropic etching with the special advantages of mechanical sawing, it is possible to generate another useful joint for the MicroJoinery "toolbox"; the diamond MicroJoint. Although, technically, the diamond MicroJoint is not a true joint, its unique addition to the MicroJoinery repertoire warrants some discussion here.

Figure 8:
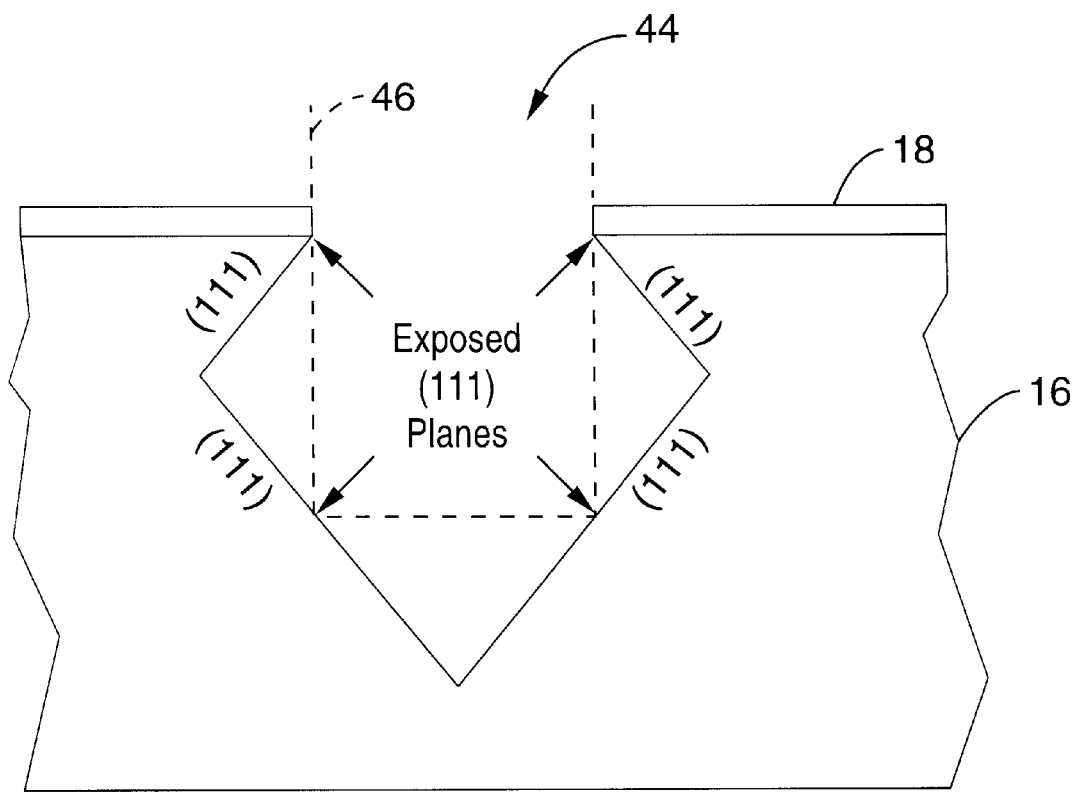
FIG. 8 is a cross-sectional diagrammatic view of a diamond MicroJoint in accordance with the present invention.

FIG. 8 illustrates the geometry and method of fabrication for the diamond MicroJoint 44. The diamond MicroJoint fabrication comprises depositing a 0.1 micrometer, LPCVD, $Si_3N_4$ etch mask 18 on a (100) silicon wafer 16, cutting through the silicon nitride etch mask into the silicon using a dicing saw to create a square kerf 46, and then anisotropically etching in KOH to termination. A diamond-shaped geometry develops naturally from the fundamental premise of anisotropic etching: silicon is removed until complete definition of all maximally exposed (111) planes. Normally, the maximally exposed (111) planes are defined solely on the silicon surface by planar photolithography. However, the saw kerf serves to expose additional (111) planes which lie buried beneath the silicon surface, and the diamond etch geometry develops naturally from the exposure of these subsurface (111) planes.

Figure 9:
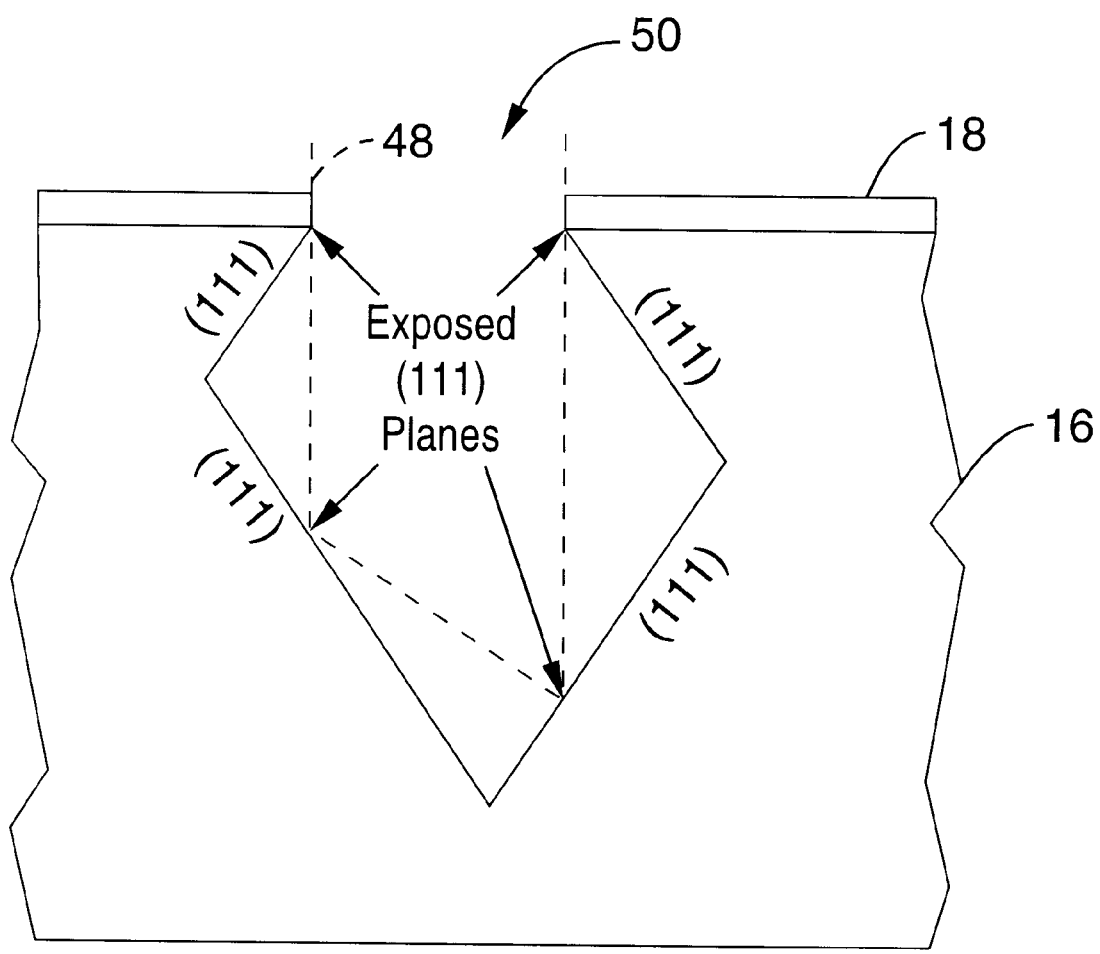
FIG. 9 is a cross-sectional diagrammatic view of skewed diamond MicroJoint in accordance with the present invention.

Myriad variations on the three-dimensional anisotropic etching theme exist. For example, a beveled saw blade that produces an angled kerf 48 results in the terminal etch geometry 50 shown in FIG. 9. Alternatively, the same geometry may be realized through multiple cuts at different depths.

Figure 10:
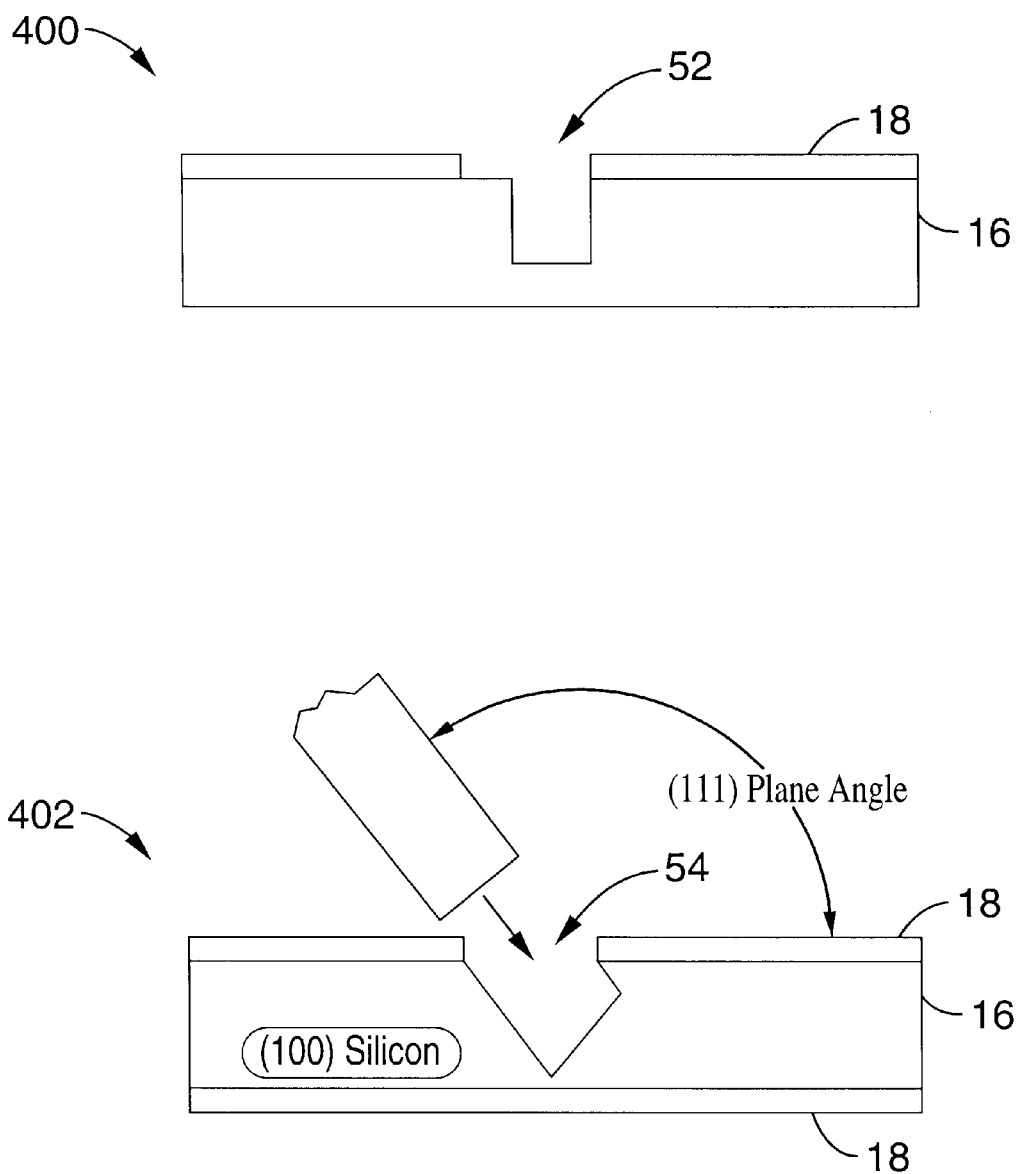
FIG. 10 is a process flow diagram showing the steps of a process for creating an angled dovetail MicroJoints in accordance with the present invention.

Another variation of the saw and etch theme may be employed to create angled dado MicroJoints as shown in FIG. 10. At step 400, the silicon 16 is patterned and grooved with a saw cut 52 as shown. Using (100) silicon generates dados at the well-known anisotropic etching angle of 54.47°. However, using off-axis wafers of arbitrary crystalline orientation, dados of virtually any angle may be easily created, including 45°dados 54, as shown in step 402.

Of course, dicing saws are not the only means to create a diamond structure. Virtually any technique that produces a three-dimensional relief in the silicon substrate will generate a diamond-shaped joint upon anisotropic etching. For example, lasers can be used to induce crystal damage in the silicon. The damaged silicon quickly etches isotropically in KOH and creates a "hole" from which the anisotropic properties of the etch then commence. Translational control over the laser allows arbitrary pattern definition, if desired. However, the well-known problems associated with anisotropic etching of exterior corners negates most of the anticipated advantages of arbitrary pattern definition.

Figure 11:
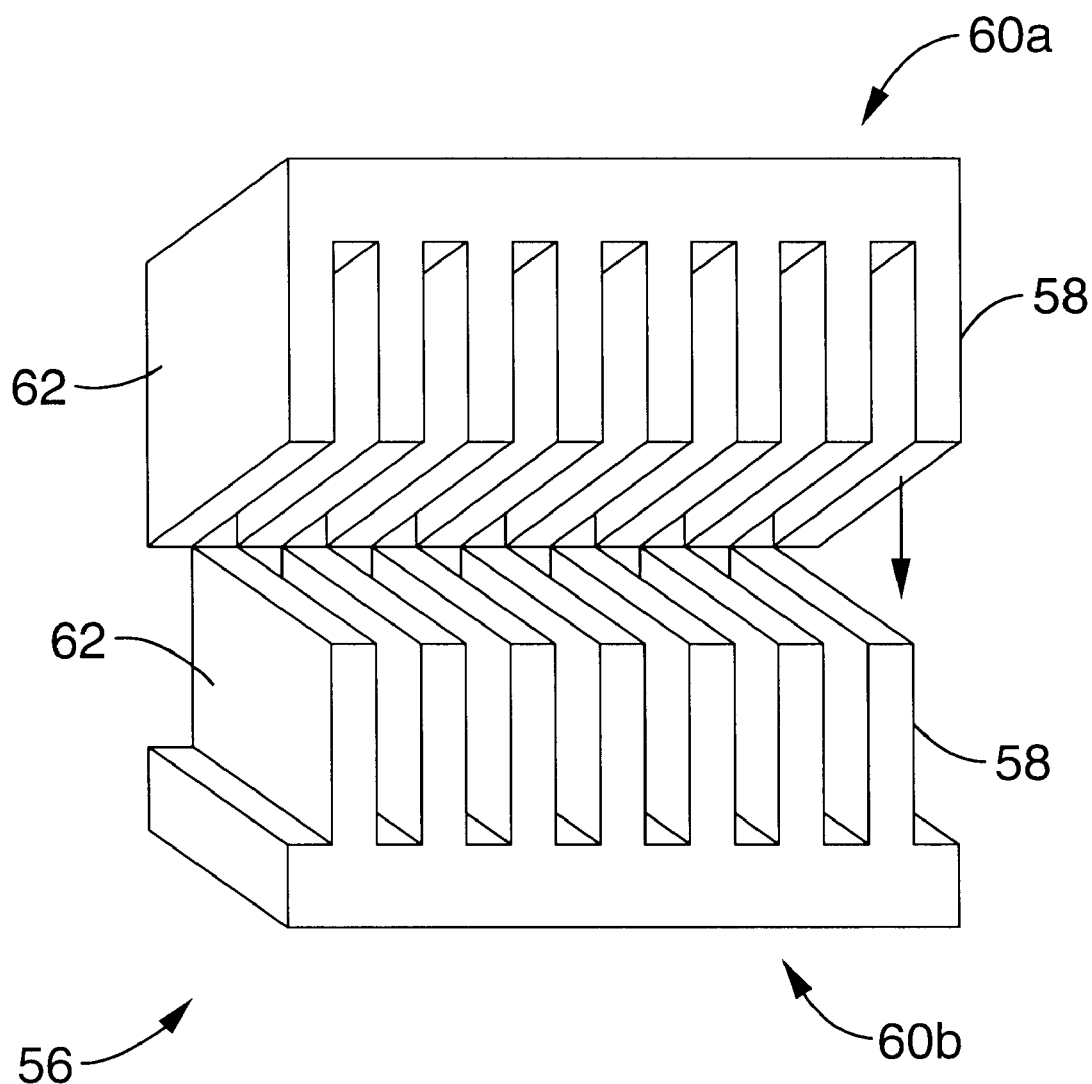
FIG. 11 is a perspective exploded view of a finger MicroJoint in accordance with the present invention.

Referring to FIG. 11, another type of MicroJoint is a finger joint 56. Finger joints are interlocking structures that feature a periodic assembly of complementary mating fins 58 as shown in FIG. 11. Normally, finger joints are used to attach two substrates 60a, 60b rigidly together. The large mating surfaces 62 of the fingers impart considerable strength and stability to the joint. Although finger MicroJoints may be used for this purpose, in the micro-world the finger joint has acquired a slightly different use. The large surface area of the fingers, surface tribology, and chemical reactivity of silicon provide an ideal motif for the reversible, modular assembly of hybrid components. The concept is best summarized by comparing the finger MicroJoint to the popular Lego® toys. Like Lego® building blocks, micromodules may be reversibly "stacked" to create entirely new microcomponents and microsystem assemblies.

Finger MicroJoints may be fabricated through a number of techniques: anisotropic etching of (110) silicon, anisotropic etching of (100) silicon, LIGA, sawing, or micromilling. Each has its own unique set of advantages and disadvantages, but we have found that sawing provides the greatest ease and flexibility in both design and selection of substrate material. Conventional circular dicing saws may be recruited to cut the finger MicroJoints into virtually any substrate material: silicon, alumina, quartz, III-V semiconductors, metal, plastics, etc. This provides considerable flexibility in hybrid system assembly where individual electronic, fluidic, or electromechanical component fabrication is extremely substrate specific. Each device may be fabricated on the material of choice and later interconnected through finger MicroJoints.

Figure 12:
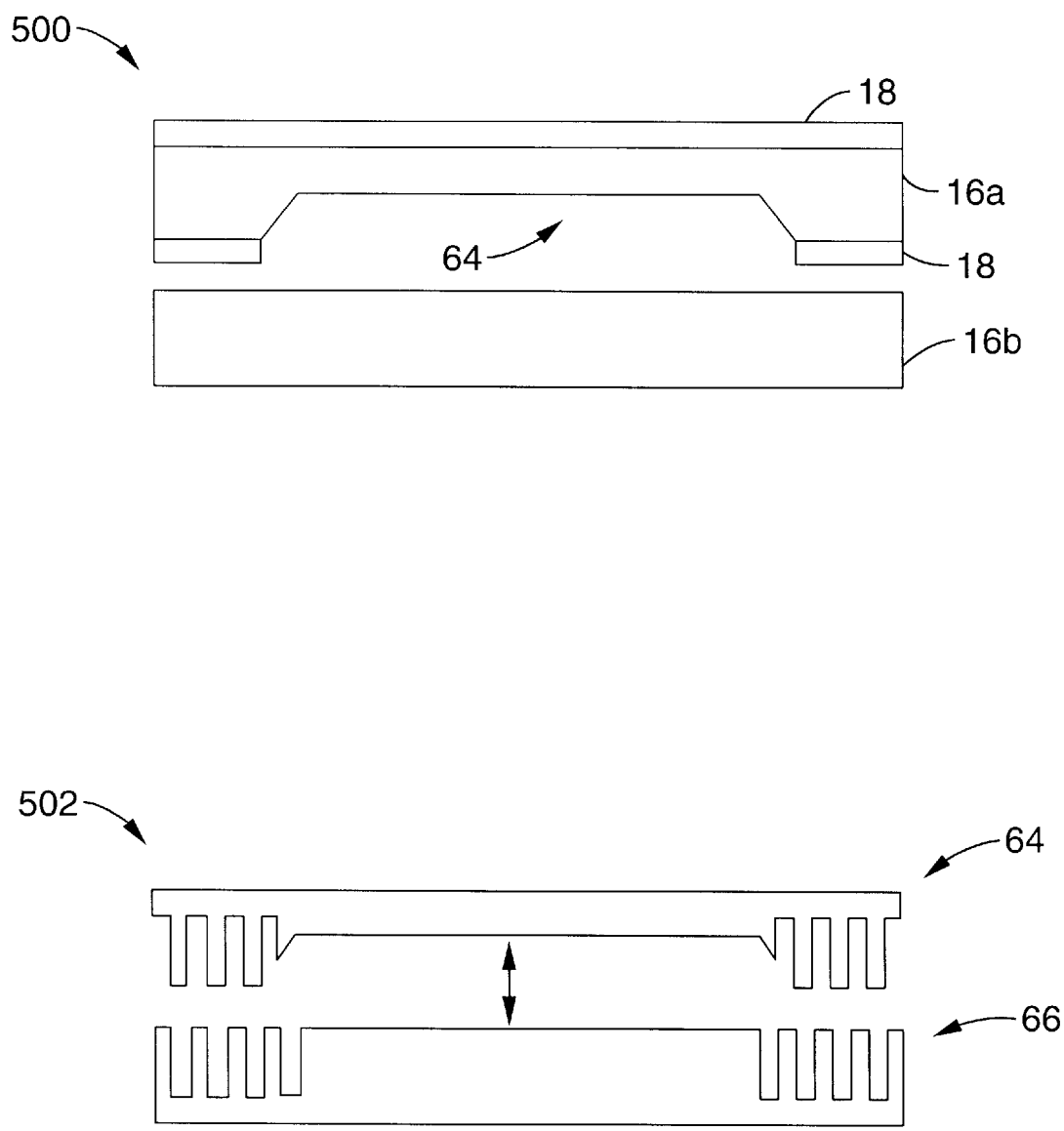
FIG. 12 is a process flow diagram showing the steps of a process for creating a finger MicroJoint in accordance with the present invention.

The fabrication of a typical finger MicroJoint interconnect on two (100) silicon wafers is shown in FIG. 12. At step 500 one (100) silicon substrate is anisotropically etched in KOH to form a depression in the middle of the wafer. At step 502, the ends of the two substrates are then "grooved" using a dicing saw to form the mating finger MicroJoints 64, 66.

Figure 13:
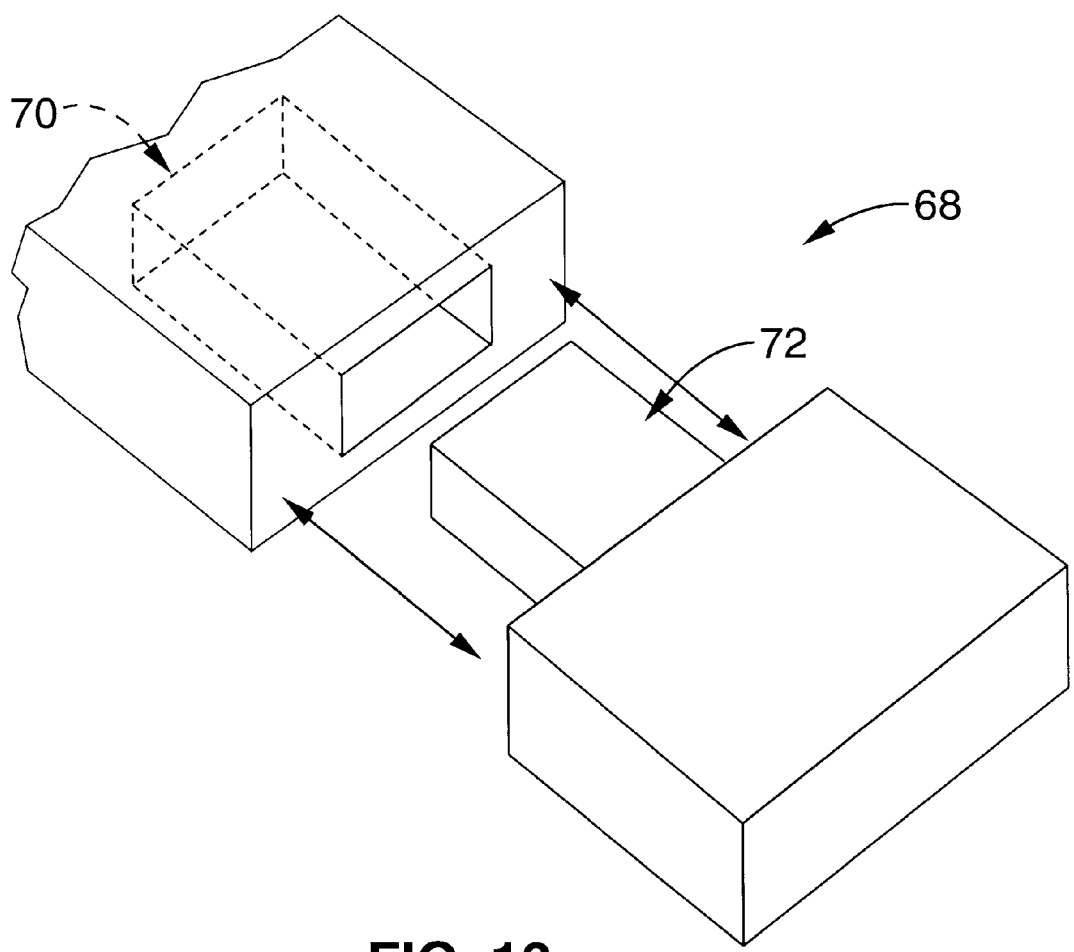
FIG. 13 is a perspective exploded view of a mortise and tenon MicroJoint in accordance with the present invention.
Figure 14:
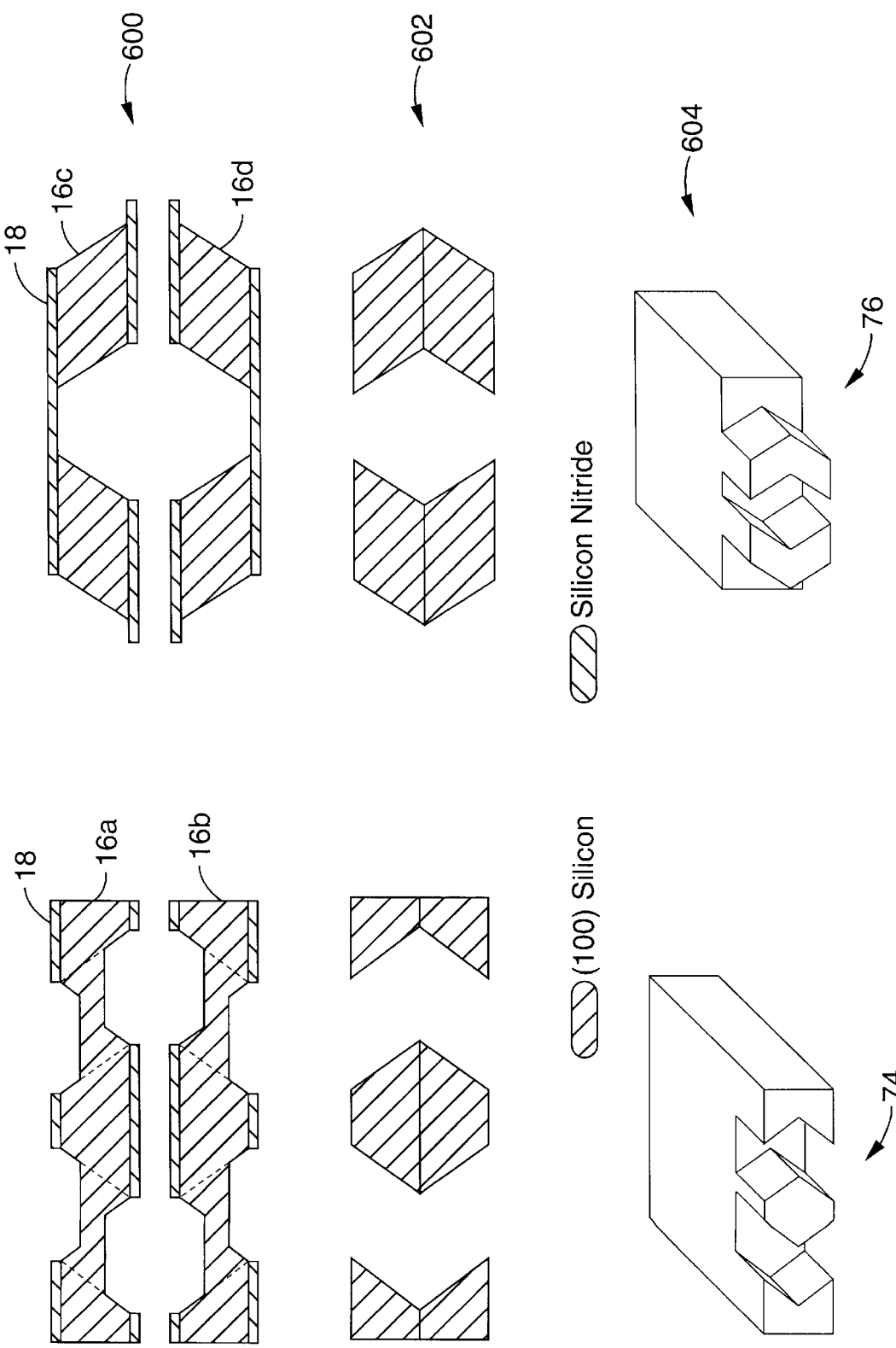
FIG. 14 is a process flow diagram showing the steps of a process used to create mortise and tenon MicroJoints in accordance with the present invention.

Another MicroJoint, the mortise and tenon joint 68, comprises a mortise 70, into which a mating tenon 72 is inserted as illustrated in FIG. 13. The "hand-in-glove" arrangement of the mortise and tenon is commonly used in the macro-world to attach two substrates rigidly together, but in the microworld the mortise and tenon joint takes on added utility. Although many embodiments of the mortise and tenon MicroJoint are possible, the fabrication process shown in FIG. 14 was found to be particularly useful in a wide variety of applications. At step 600, a 0.1 micrometer film 18 of LPCVD $Si_3N_4$ is deposited and patterned on four (100) silicon wafers 16a, 16b, 16c, 16d. At steps 602 and 604, the wafers are then anisotropically etched in KOH to produce the angled (54.74°) openings shown, aligned, and fusion-bonded together to form the mating mortise and tenon components 74, 76 shown.

Figure 15:
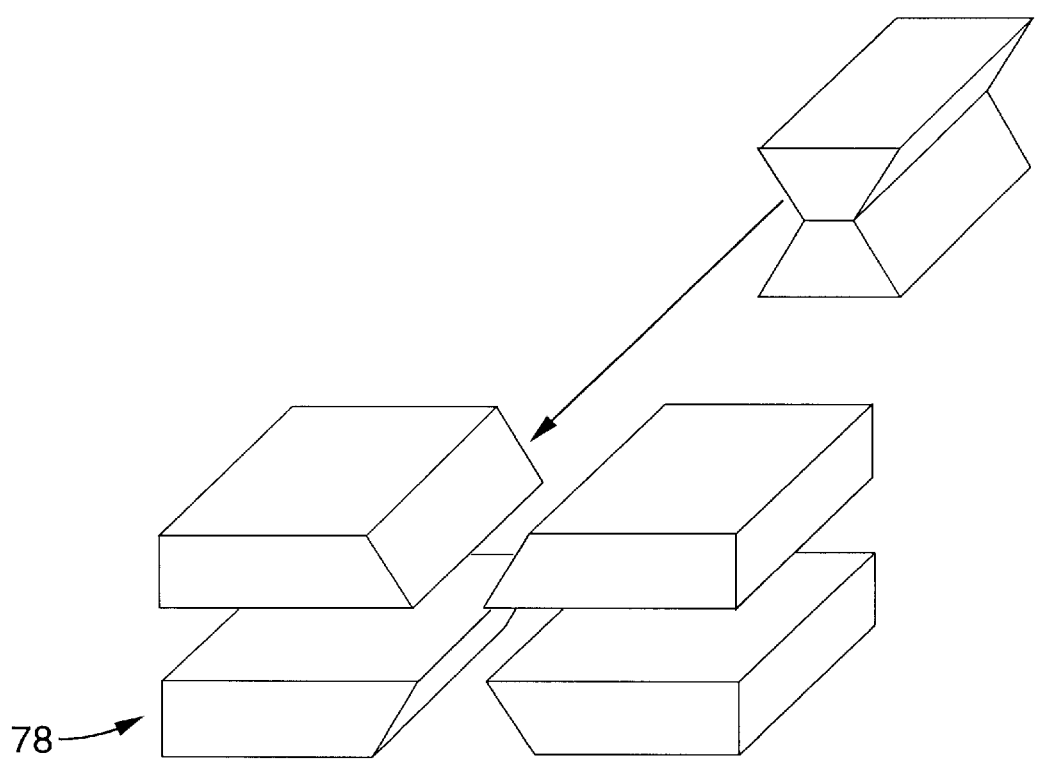
FIG. 15 is an exploded perspective view of double dovetail MicroJoint in accordance with the present invention.
Figure 16:
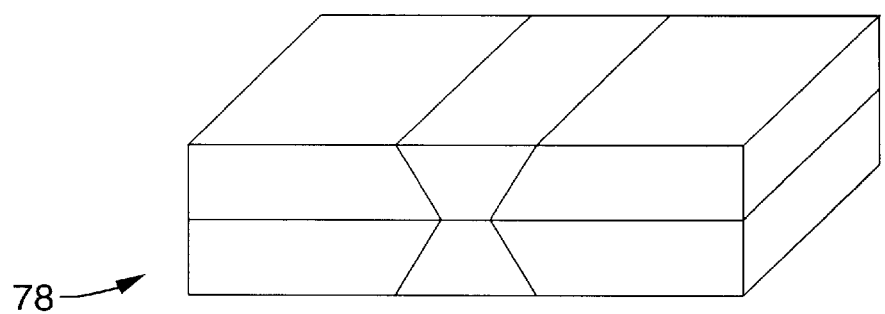
FIG. 16 is an assembled perspective view of the double dovetail MicroJoint shown in FIG. 15.
Figure 18:
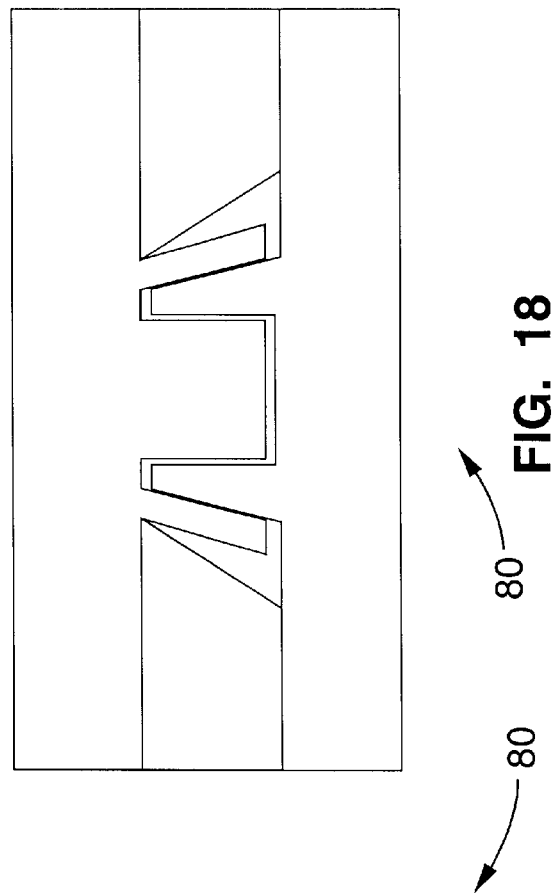
FIG. 18 is an assembled front elevation view of the push and lock MicroJoint shown in FIG. 17.
Figure 17:
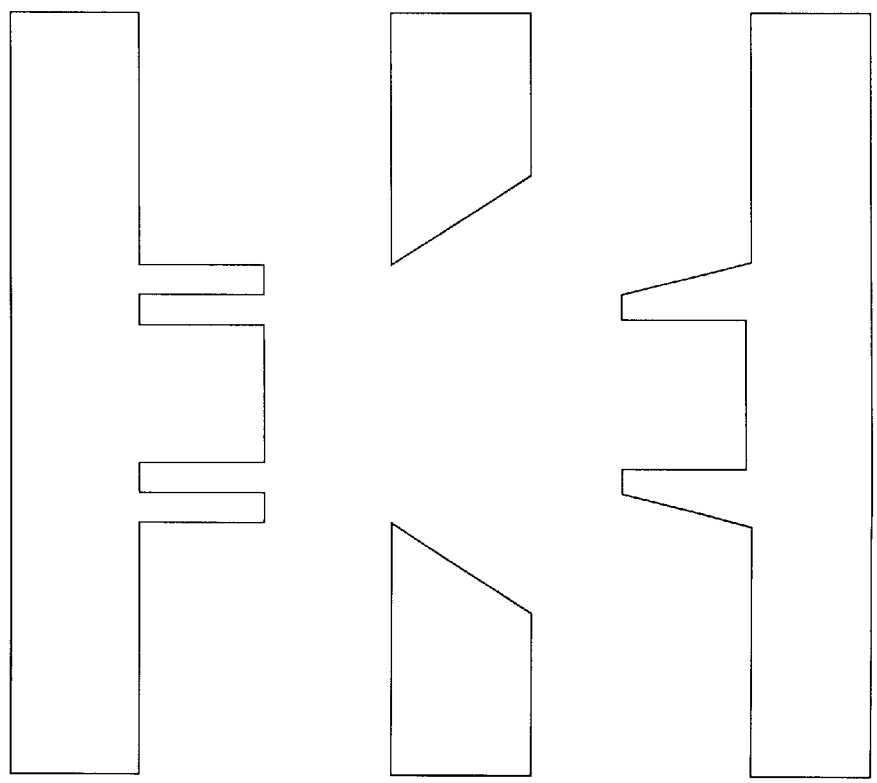
FIG. 17 is an exploded front elevation view of a push and lock MicroJoint in accordance with the present invention.
Figure 19:
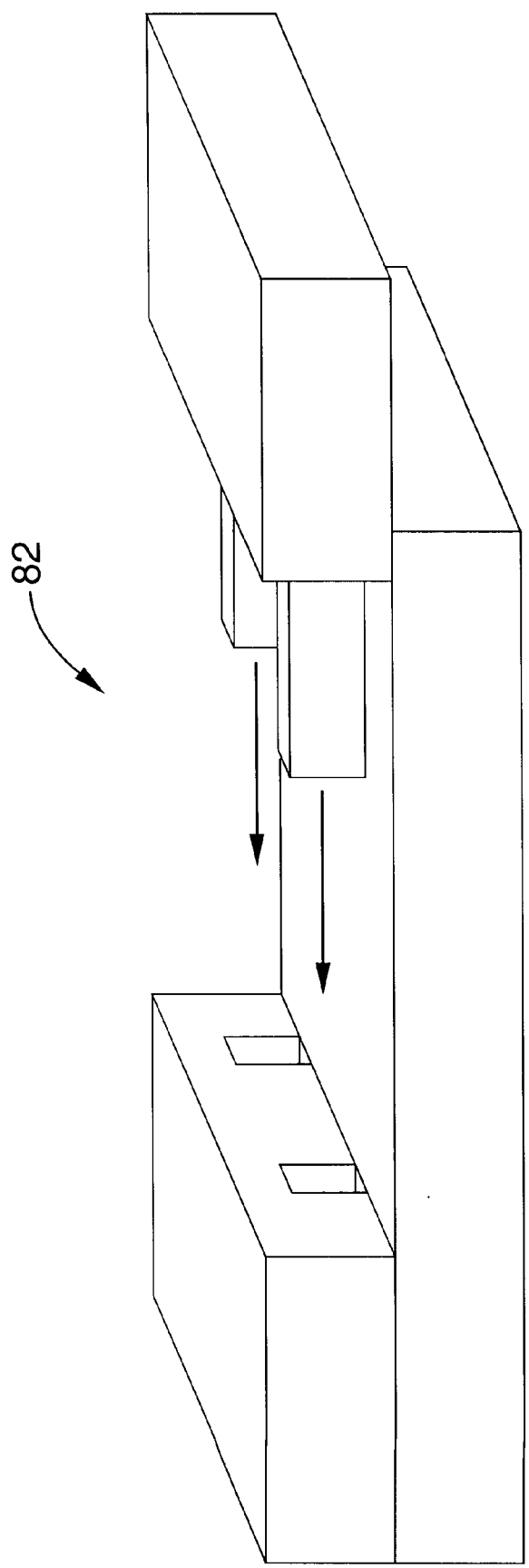
FIG. 19 is a perspective exploded view of a slide and lock MicroJoint in accordance with the present invention.
Figure 20:
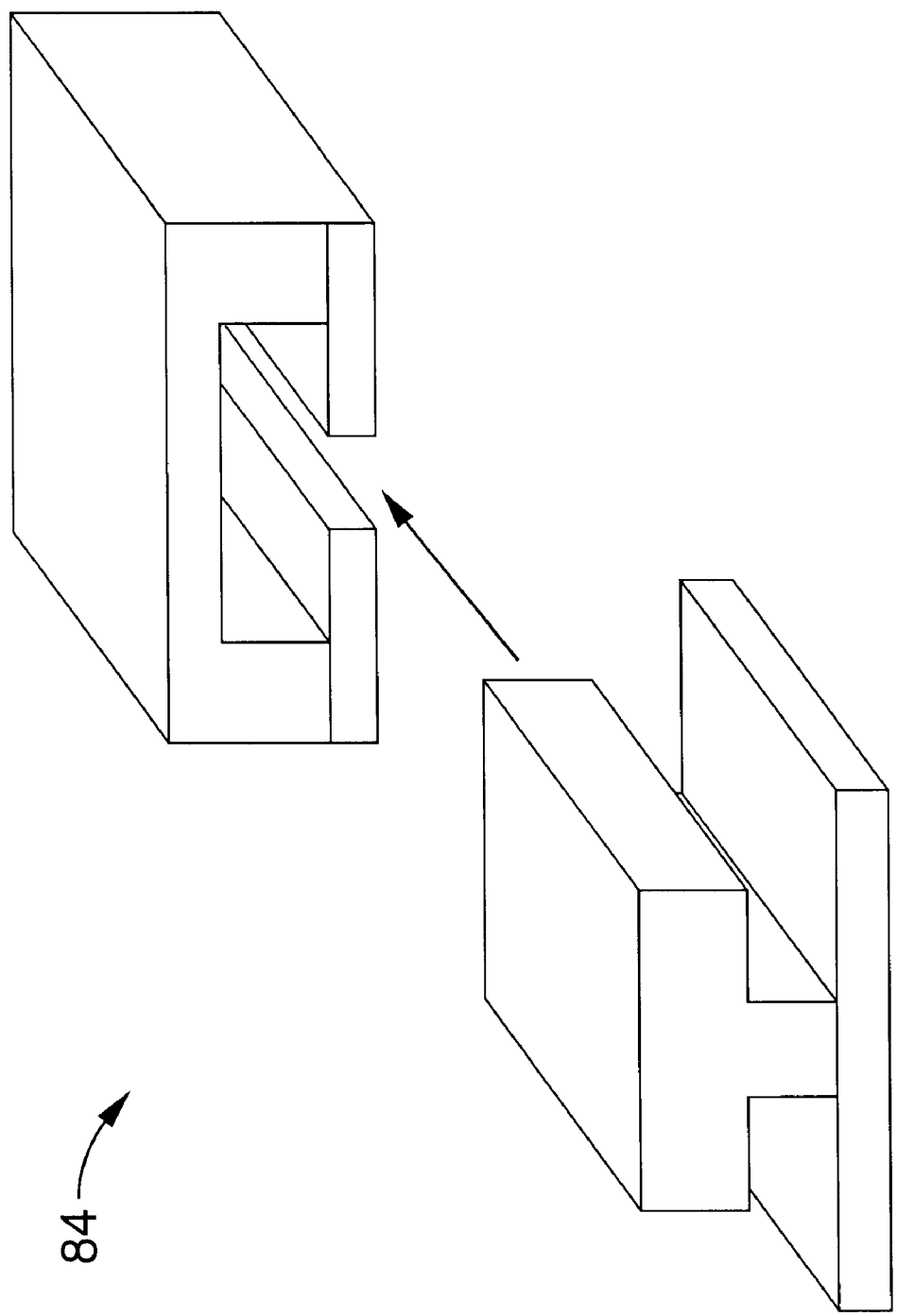
FIG. 20 is a perspective exploded view of a T-locking MicroJoint in accordance with the present invention.
Figure 21:
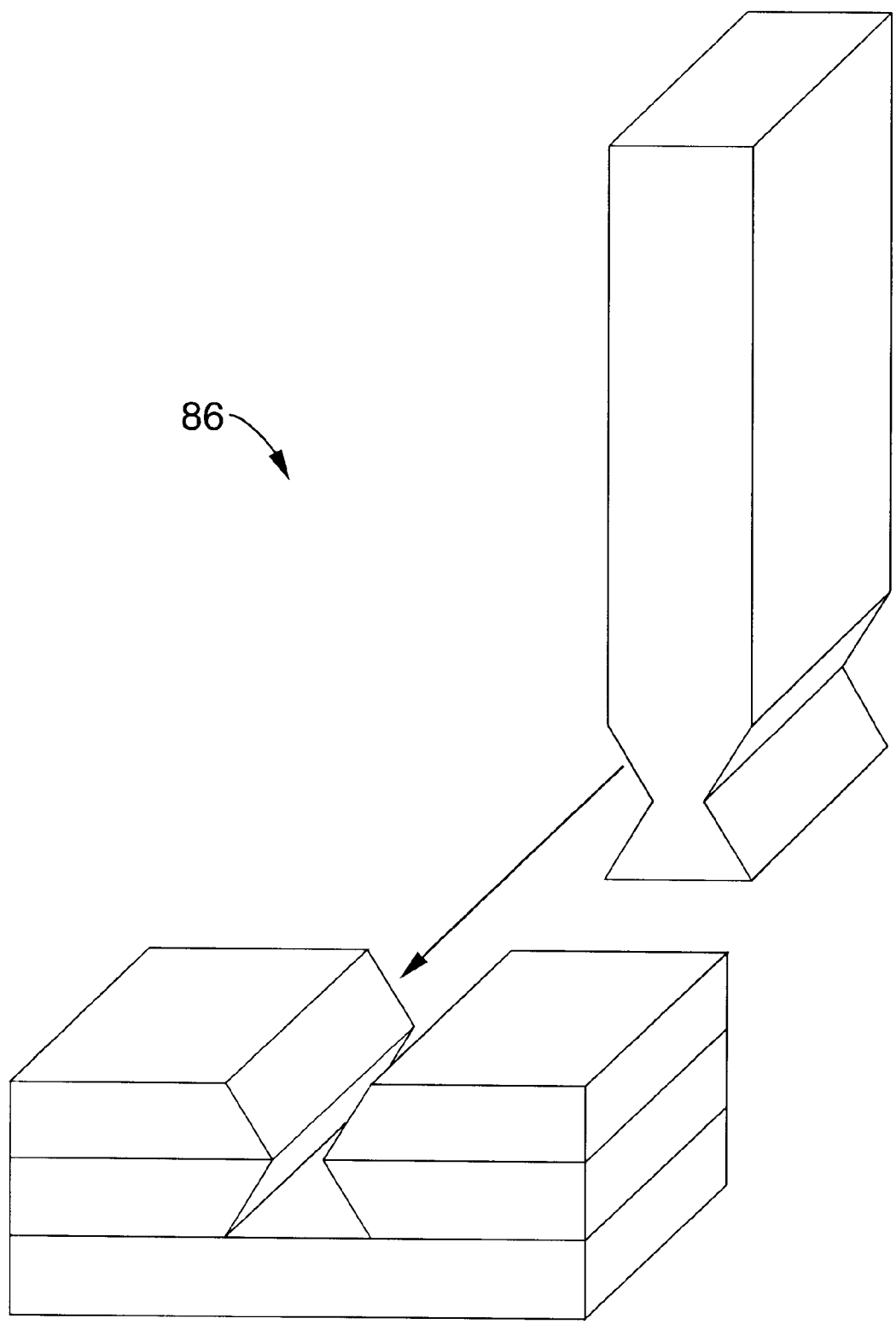
FIG. 21 is a perspective exploded view of a dovetail dado MicroJoint in accordance with the present invention.

Other MicroJoints include various combinations of the previous joints. These joints include: (i) a double inverted dovetail structure 78 as shown in FIG. 15 and FIG. 16 which can be used to secure two substrates together without permanently bonding them, (ii) a push and lock joint 80 as shown in FIG. 17 and FIG. 18, (iii) a slide-and-lock joint 82 as shown in FIG. 19 which can used to mount and lock components laterally, (iv) a T-locking joint 84 as shown in FIG. 20, and (v) a dovetail dado joint 86 as shown in FIG. 21. Of course many other MicroJoint possibilities exist. Hinge and pinjoints commonly used in surface micromachining are merely subsets of the larger collection of all MicroJoints. LIGA has produced an interesting set of MicroJoints which also belong under the universal umbrella of MicroJoinery.

EXAMPLE 1

A dovetail MicroJoint was fabricated in (100) silicon. The two parts of the dovetail MicroJoint were constrained in the transverse directions but were free to move relative to each other along the axis of the joint. The anisotropically etched (111) planes were clearly visible at the characteristic 54.7° etch angle and provide the bearing surfaces upon which translation occurs. Actual MicroJoint tolerances were modified from the theoretical ones by two well-known limitations of anisotropic etching: etch mask undercutting and etch mask misalignment to the (110) planes. Both phenomena resulted in a general widening of the etched regions (decrease in x and q with a simultaneous increase in w and r) increasing the slop in the joint. Using alignment of a silicon nitride etch mask to the silicon wafer flat (±1°), dovetail MicroJoint tolerances ranging anywhere between 5 and 8 micrometers were routinely obtained. So far, these tolerances have proven adequate for most applications. However, techniques exist to define accurately the (111) planes independent of the wafer flat. Aligning to these specially etched keys provides dovetail tolerances less than 1 micrometer for precision applications.

Surprisingly, the measured runout of the dovetail microstage proved to be significantly better than the joint tolerances would indicate. Runout was measured by mounting a small mirror on a 6 mm×3 mm dovetail microstage and recording the displacement of a HeNe laser reflecting off the mirror as the microstage moved. Both specular reflection and interference were used to measure runout. All microstages tested had joint tolerances ranging anywhere between 6 and 8 micrometers. The maximum possible runout of the microstage occurred when the microstage was intentionally twisted in the joint. Under these severe conditions, the laser beam showed a displacement of approximately 10 mrad, which generally reflects the known joint tolerance. However, under normal translation the microstages ride on the virtually perfect (111) crystal planes created during anisotropic etching and show less than 0.1 micrometers of runout and rotations (roll, pitch, yaw) of less than 10 $\mu$rad over translational distances of up to 8 cm. The most common source of runout and/or jitter under normal translation was generated by the familiar anisotropic etch terracing formed from etch mask misalignment to the (110) planes. This error can be reduced by more carefully defining crystal planes as mentioned above.

Wafer warpage also contributes to runout of the microstages as a slow creep. Over short translational distances this runout is usually negligible. However, as the translational distance increases, so does the warpage-induced runout, and applications with large microstage translations require careful attention to initial substrate warpage as well as any process-induced warpage. Normally, commercially available silicon wafer stock is sufficiently devoid of wafer warpage for most applications. However, high-temperature wafer processing can induce considerable warpage, particularly when combining two materials with large differences in thermal coefficients of expansion.

To avoid thermally induced warpage, all dovetail MicroJoints were processed entirely from silicon and fusion-bonded with the crystal orientations of both wafers aligned. Additionally, any films, such as silicon nitride, were deposited symmetrically on all sides of the wafer to minimize stress. To avoid the stiction problems that continually plague surface-micromachined mechanical structures, the dovetail MicroJoints are preferably coated with 0.1 micrometers of LPCVD silicon nitride. Silicon nitride not only provides excellent wear resistance (hardness of 9 on the Knoop scale), but also demonstrates very little stiction/friction between moving parts even after continuous loading for over six months. Initial work indicates that friction can be further reduced through the deposition of anti-friction surface coatings. Plasma-deposited polyfluorinated hydrocarbons have been shown to reduce friction on the dovetail MicroJoints. However, for most applications, the increased processing required to deposit the polymers did not justify the incremental decrease in friction. It is contemplated that tribology of the silicon nitride surfaces, deposition of anti-friction coatings, and translation at cryogenic temperatures may prove useful in this regard.

EXAMPLE 2

The development of the diamond MicroJoint with etching time was documented through successive cross-sectional profiles, starting with a square saw kerf. The four corners of the saw kerf eventually define the terminally etched (111) planes. After anisotropic etching in 45% KOH for 45 minutes, the etching proceeded equally in all exposed (100) directions (both laterally and vertically) to produce a roughly octagonal geometry which has possible application as fluidic channels, vias, etc. After 90 minutes of etching, a diamond shape began to form. Because of the dimensions chosen for the initial kerf, the lateral etching reached termination while the vertical etching was still in progress. The opposite scenario can be achieved by increasing the depth-to-width ratio of the original kerf. The final terminated microstructure profile was a well defined diamond geometry.

EXAMPLE 3

Figure 22:
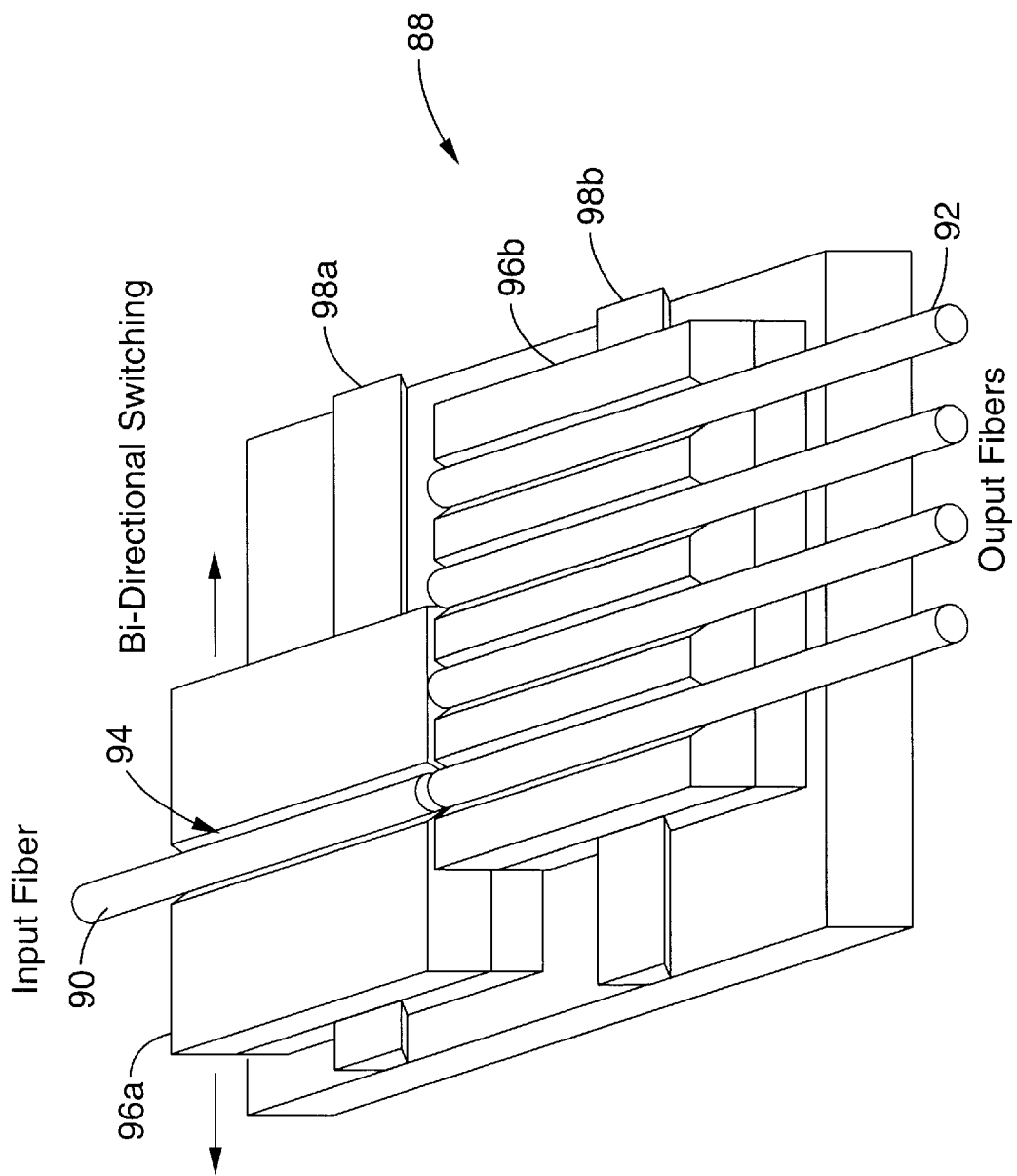
FIG. 22 is a perspective diagrammatic view of a 1×4 fiber-optic switch with dovetail MicroJoints in accordance with the present invention.

The dovetail MicroJoint has considerable utility in microphotonic and fiber optic applications. One such application is the fiber optic switch 88 shown in FIG. 22. In this application multimode input 90 and output 92 fibers were cleaved and mounted in anisotropically etched v-grooves 94 on the dovetail translational stages 96a, 96b. The optical energy of a 7 mW HeNe laser (Coherent Radiation), was switched from input to the appropriate output fiber by translating the input microstage along the dovetail Micro-Joint 98a until the input fiber is aligned with the desired output fiber. Although both the input and output fibers were mounted on dovetail microstages 98a, 98b, respectively, and could be independently translated, only the input micro stage was actuated in this application. The output stage was fixed to the substrate.

Actuation of the input stage is accomplished by depositing a ferromagnetic film such as iron, permalloy, etc., on the input stage and activating electromagnets positioned at either end of the microstage. Retractable detents or pins placed under or at the side of the translational stage provide stops which align the input fiber(s) to the appropriate output fiber(s). Using this actuation, the microstage required approximately 650 mN of force to obtain an average velocity of 108 mm/sec over a distance of 1.0 mm. Table 1 compares the unoptimized performance of the microfabricated fiber optic switch with two similar commercial switches.

TABLE 1

|  | MicroJoinery Switch | DiCon 2 × 2 Multimode Fiber Optic Switch | E-Tek 2 × 2 Multimode Fiber Optic Switch |
| --- | --- | --- | --- |
| Switching Time | <10 msec | 25 msec max. | 10 msec |
| Optical Transition Time | <1 msec | not given | 1 msec |
| Insertion Loss | −1 dB | −0.5 dB to −1 dB | −0.4 dB to −0.7 dB |
| Cross Talk | <−80 dB | −80 dB | −45 dB |
| Switch Size | .082 cm$^3$ | 23 cm$^3$ | 40 cm$^3$ |

Figure 23:
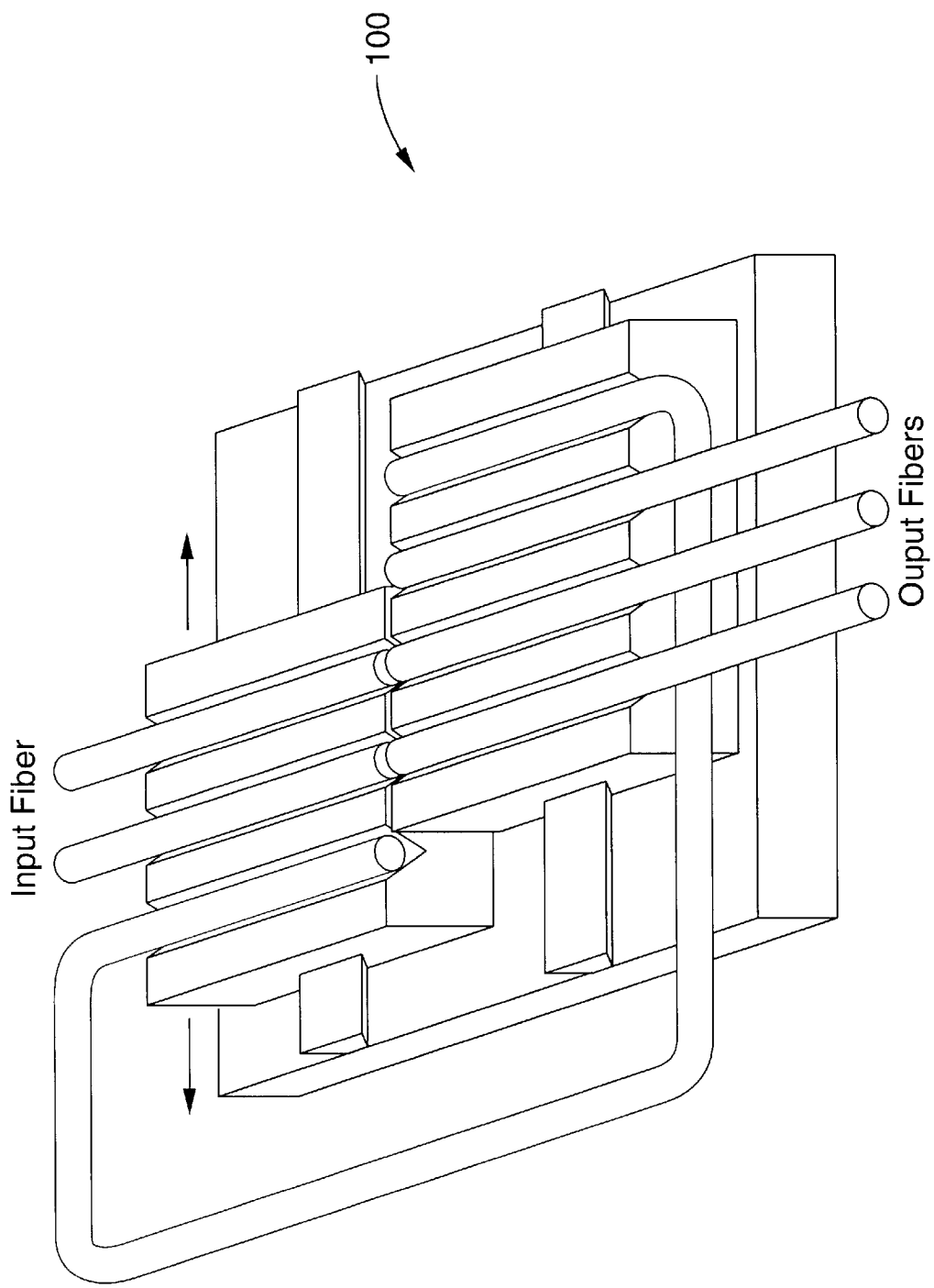
FIG. 23 is a perspective diagrammatic view an n×m fiber-optic switch with dovetail MicroJoints in accordance with the present invention.

Even without optimization, the microfabricated fiber optic switch compares favorably, while providing the additional luxury of a significantly reduced size and the ability to easily scale up to virtually any number of output/input channels desired. Additionally, extensions to other switch designs are easily accommodated, such as the n×m fiber optic switch 100 shown in FIG. 23.

EXAMPLE 4

Figure 24:
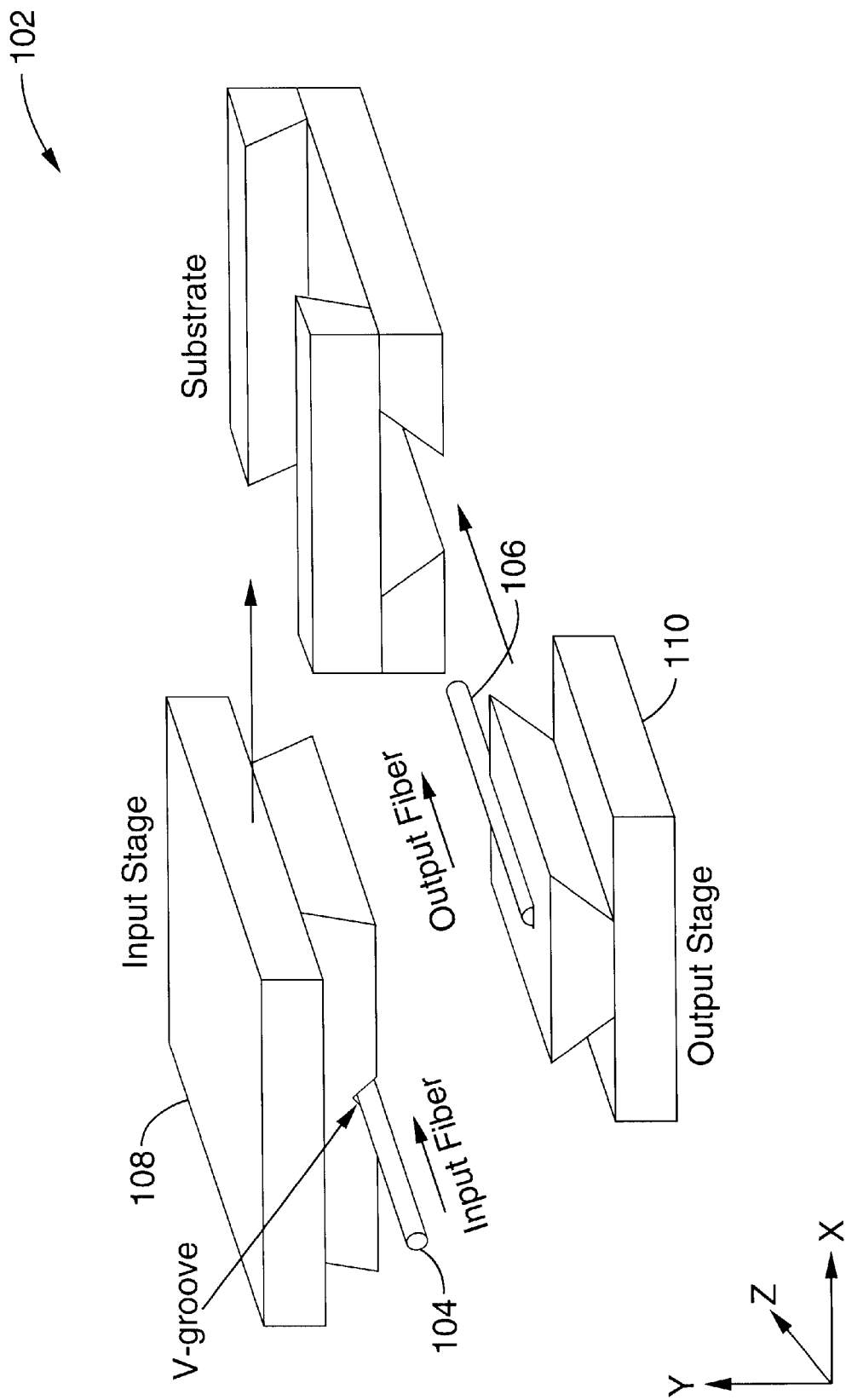
FIG. 24 is a diagram showing the construction and operation of a fiber-to-fiber aligner/coupler using dovetail MicroJoints in accordance with the present invention.

Another important optical application of the dovetail MicroJoint is the fiber-to-fiber aligner/coupler 102 shown in FIG. 24. In this application two single mode, 6 mm core, 1064 nm optical fibers 104, 106 (Corning) are cleaved and mounted opposite each other on two separate, orthogonally bonded dovetail MicroJoints 108, 110 so that the two fibers are free to move relative to each other along their longitudinal axis, z, and transverse to each other in the x direction. Anisotropically etched v-grooves again aid in fiber attachment to the microstage. A 1 mm film of vacuum deposited aluminum on the surface of the v-grooves provide mirrors on the end (111) planes to reflect the optical beams. The optical beam exiting the terminus of one of the fibers is directed towards the end (111) silicon plane, reflected to the complimentary (111) plane located on the second microstage, and finally reflected into the second fiber. Optical beam coupling between the two optical fibers occurs by relative translation of the two fibers in the z and x directions. Movement of the fibers longitudinally in the z direction walks the beam across the (111) mirrors producing vertical, y, alignment capabilities. Independent movement of the second dovetail microstage produces full x and y alignment capabilities to align and couple the optical beam between the two fibers.

Using a 1064 nm, Nd:YAG laser as the optical source, the output intensity was measured with a silicon p-i-n photodiode (Thor Labs), and the microstages were actuated by mechanically coupling them to picomotor translational stages (New Focus). As expected, the coupling profiles exhibited Gaussian intensity distribution for alignment in both the x and y directions. Large widths of the Gaussian profiles (FWHM) observed reflected the divergence of the beam over the relatively long optical path lengths between fibers. A difference in the profiles for the two microstages resulted from the difference in the mechanical amplification of the two microstages. For the x alignment, there is a one to one correspondence between the distance the microstage is displaced and the distance the beam is displaced. However, for the y alignment, the beam displacement is amplified by the angle of the two mirrors according to the equation $a/b=\tan(\theta)$ where a is the microstage displacement, b is the beam displacement, and θ is the angle of the mirrors with respect to the fiber axis. Using silicon (111) crystal planes with an angle of 54.7°, results in a 1.4 scaling factor between microstage and beam displacements, i.e. a 1 micron displacement of the microstage produces a 1.4 micron beam displacement. Ideally, scaling factors much less than unity are preferred for fiber coupling, i.e. large microstage displacements result in small beam displacements. However, this limitation is not necessarily problematic for actuation mechanisms that have a high degree of resolution. An alternative solution is accomplished by changing the mirror angle to realize a different mechanical amplification. For example, a mirror angle of 6° may be easily fabricated by conventional lapping and polishing techniques and used as the reflecting surfaces instead of the anisotropically etched (111) planes. A 60° mirror will produce a 10:1 displacement ratio, and allows the dovetail optical aligner to be coupled with conventional micrometers for precision alignments. The long optical path-length of the coupler, approximately 250 mm, resulted in rather low coupling efficiencies, approximately −21 dB. Calculated optical losses for the expected optical path-lengths were −15 dB assuming a NA of 0.11 for the optical fiber, a Gaussian profile for the beam, and 100% reflectance from the two Al end mirrors. These exorbitant losses generally prohibit any serious consideration of the present optical coupler/aligner design in any practical applications. The design and data given here are presented mainly to show proof of principle for the dovetail aligner/coupler. However, future modifications to improve efficiency include the addition of index matching fluids and/or GRIN micro-lenses to collimate the beams. GRIN lenses are commonly used in similar commercial optical couplers to collimate optical beams and generally exhibit a nominal −3 dB loss.

EXAMPLE 5

Figure 25:
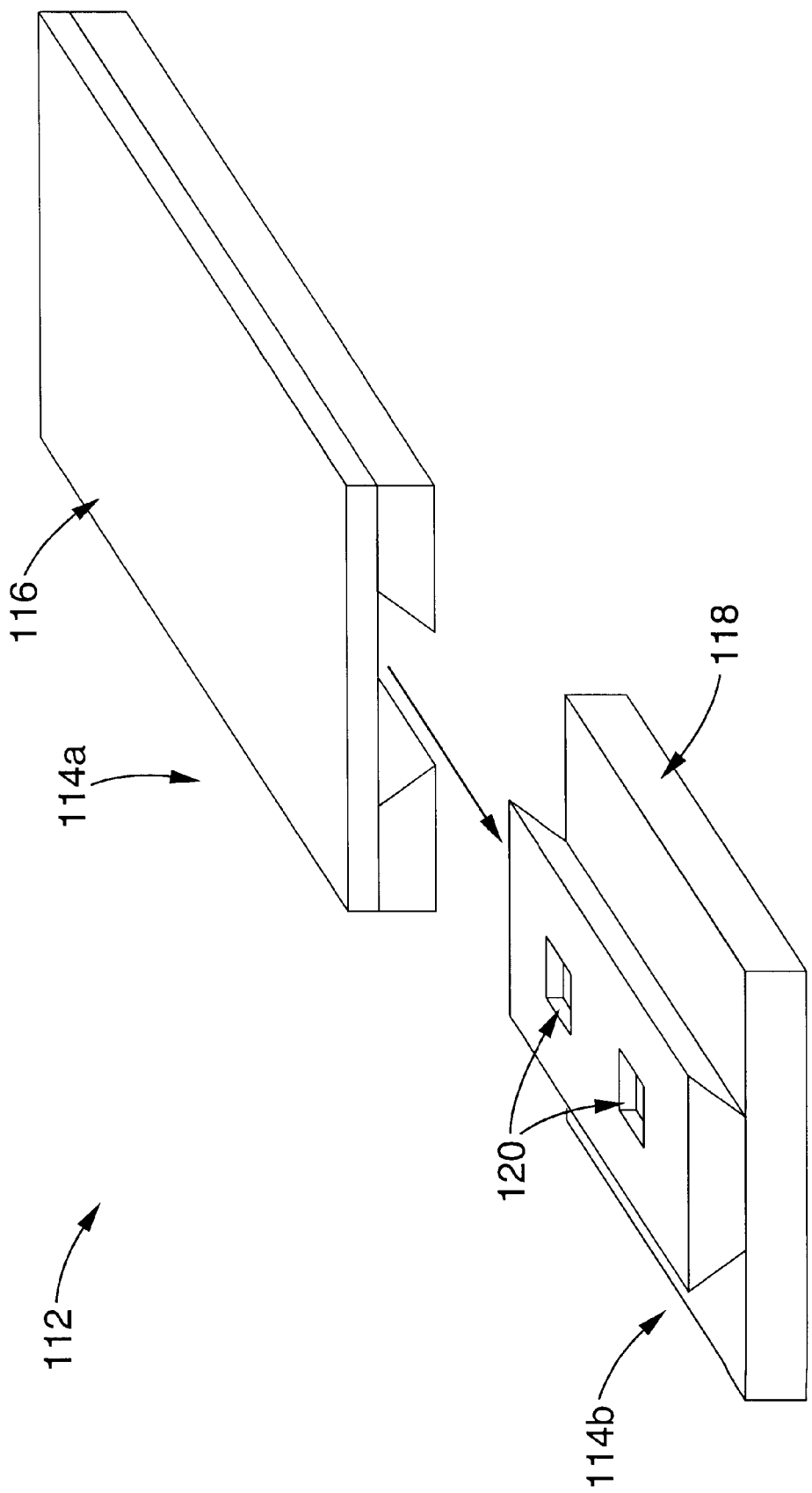
FIG. 25 is a perspective exploded diagrammatic view of a bugbox using a dovetail MicroJoint in accordance with the present invention.

Microscopy offers another potential application for the dovetail MicroJoint. By definition, microscopy deals exclusively with the micro world, and there has always been a need to conveniently handle, prepare, confine, and store extremely small samples for visualization. Here MicroJoinery provides a rather unique solution. Using dovetail MicroJoints, arrays of specimen containers can be microfabricated to hold microscopy specimens in a "micro-filing cabinet" for storage and/or visualization. These specimen holders hive become known as "bugboxes" in honor of their originally intended purpose. An example of a bugbox 112 is shown in FIG. 25. The two sections 114a, 114b are fabricated from a glass lid 116 and a glass bottom 118 mated with dovetail MicroJoints to allow the two sections of the "bugbox" to open and close like drawers. The drawers contain the storage compartments 120 which hold the different samples. Closing the drawers confines or seals the samples for storage or inspection. The top and bottom surfaces of the "bugbox" are made from glass to accommodate both transmission or reflectance microscopy. The "bugbox" is fabricated using anisotropically etched (100) silicon in a process flow similar to that shown in FIG. 2 with the exception that the desired specimen compartments are etched into the silicon at the same time as the dovetail MicroJoints are being defined, and the glass (Corning 7740) is anodically bonded to the etched silicon wafer instead of a fusion bonded silicon wafer. Anodic bonding was performed on a Suss BA6 Wafer Bonding Station.

The "bugboxes" have been used to study the reproductive cycle of nematodes. Because live nematodes are mobile and require an aqueous environment, it is difficult to confine a single specimen within the microscope field of view for long examination periods. Rather than continually adjusting the microscope to follow the movements of a single nematode, the nematodes are confined within a "bugbox" to restrict their movements. Future extensions of the "bugbox" would integrate fluidic control to deliver test reagents and profuse the solutions (see later sections for fluidic applications).

Another interesting application of the "bugbox" is the storage of fragile microscope specimens such as radiolarians. Radiolarians are single celled creatures that secrete rather large silica exoskeletons (100 mm to 500 mm). Although some radiolarians exist today, most specimens are the fossilized remains of ancient species. The exoskeletons generally resemble spheres with long dendrite-like spikes protruding from them. The dendrites (and radiolarians) are extremely fragile and even the most delicate manipulations shatter the exoskeletons making microscopy examination and long term storage problematic. FIG. 13 shows a collection of fossilized radiolarians stored safely within a dovetail "bugbox". An additional advantage to the "bugboxes" which is the reflective nature of the (111) silicon side walls. With carefully designed dimensions for the anisotropically etched square "pits", the specimens may be viewed from all sides simultaneously, enhancing the quality and ease of microscopy observation.

EXAMPLE 6

Figure 26:
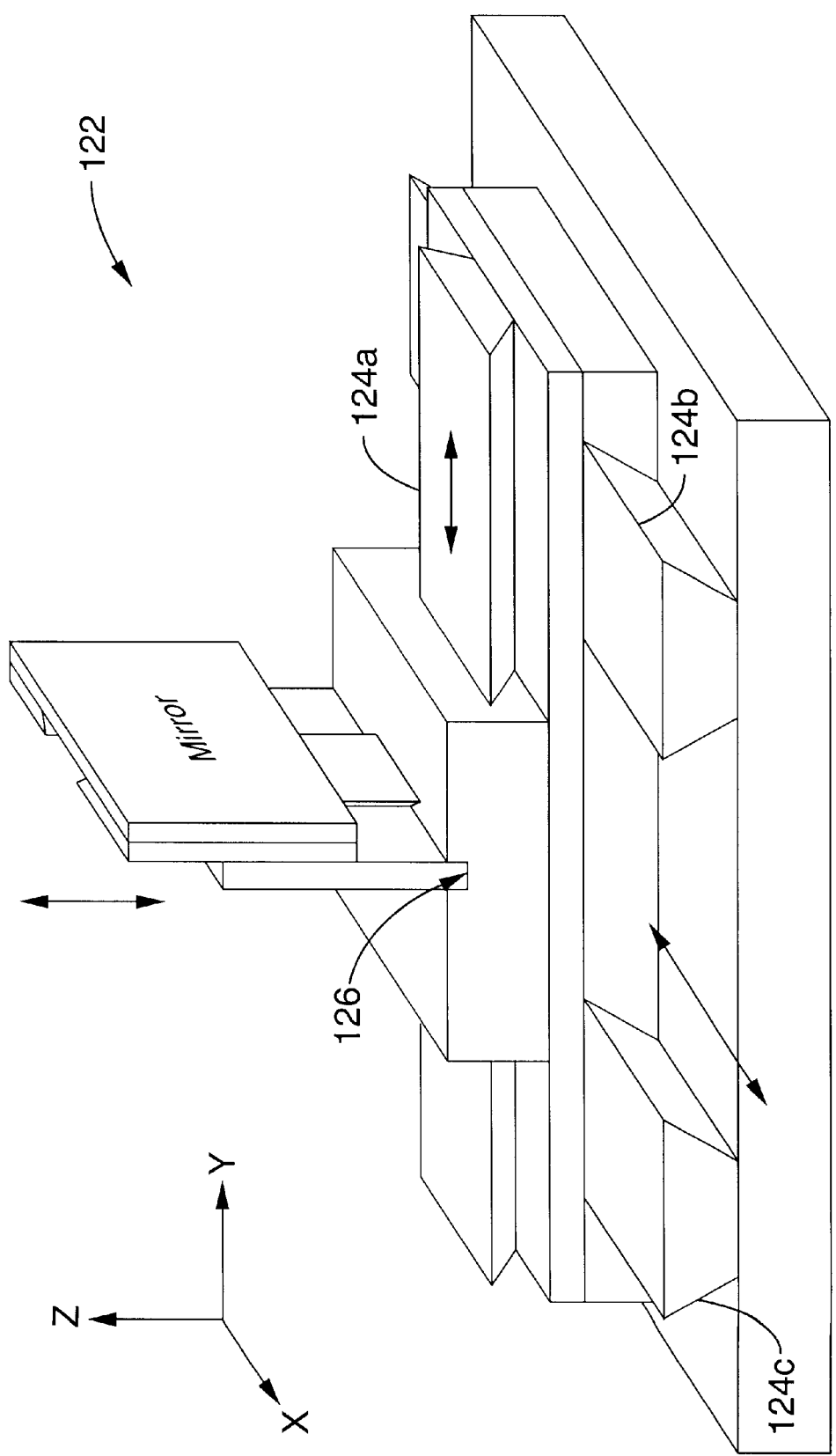
FIG. 26 is a perspective diagrammatic view of a xyz optical microstage with dovetail translational MicroJoints and a dado MicroJoint to attach the z microstage in accordance with the present invention.

When combined with the dovetail MicroJoint, the dado MicroJoint can be used to realize a fully functional xyz microstage for the precision mechanical alignment of optical components, manipulation of biological specimens, etc. The basic design of the xyz microstage 122 is shown in FIG. 26. Three linear dovetail microstages 124a, 124b, 124c are bonded together to provide independent mechanical translational in the x, y, and z directions The x and y microstages are formed by rotating two linear dovetail microstages 90° and bonding them together using simple organic adhesives, fusion bonding, reflow glasses, etc. The attachment of the z microstage is accomplished using the dado MicroJoint 126. A groove was cut in the surface of the top microstage using a standard dicing saw (MicroAutomation) operated at 15K rpm and a feed rate of 20 mm/min. Multiple passes of a 250 $\mu$m thick diamond coated saw blade were used to create a 420 m kerf into which the z microstage was inserted and bonded, again using either organic adhesives, reflow glasses, or fusion bonding. Orthogonal alignment of the dado MicroJoint was accomplished by hand. Although not used in this particular application, anisotropic etching of alignment keys into the different microstages allows virtually perfect alignment to crystallographic planes thereby eliminating any cross-talk between the stages. Although microstages as small as 100 $\mu$m and as long as 10 cm have been fabricated, the approximate size scale between a U.S. quarter and penny coin has proven most popular. At this scale the microstages are smaller than anything available commercially yet still large enough to actually be useful.

EXAMPLE 7

The geometries created by the diamond MicroJoint are ideally suited to fiber optic applications as couplers, guides, or interconnects. An array of optical fibers were mounted in diamond MicroJoints to form a multi-fiber optic interconnect. The terminal ends of the fibers were cleaved and extended out the end of the substrate. A corresponding array of diamond MicroJoints was fabricated in a second wafer and the grooves were also loaded with recessed optical fibers. Insertion of the optical fibers into the mating substrate creates an optical fiber quick-connect to couple different optical modules. Tapers etched into the receiving substrate guide the fibers into the joints for easy insertion and index matching gels improve coupling.

EXAMPLE 8

A silicon "stud" was anisotropically etched to mate with the geometry of the diamond groove and inserted into the diamond groove to form a micromechanical translational stages similar to the dovetail MicroJoint. The "stud" was free to move along the axis of the joint and behaves as a self constrained joint. The "empty" space below the stud is pressurized to provide air bearings for the stud or used to provide mechanical, pneumatic or hydraulic actuation control.

EXAMPLE 9

Figure 27:
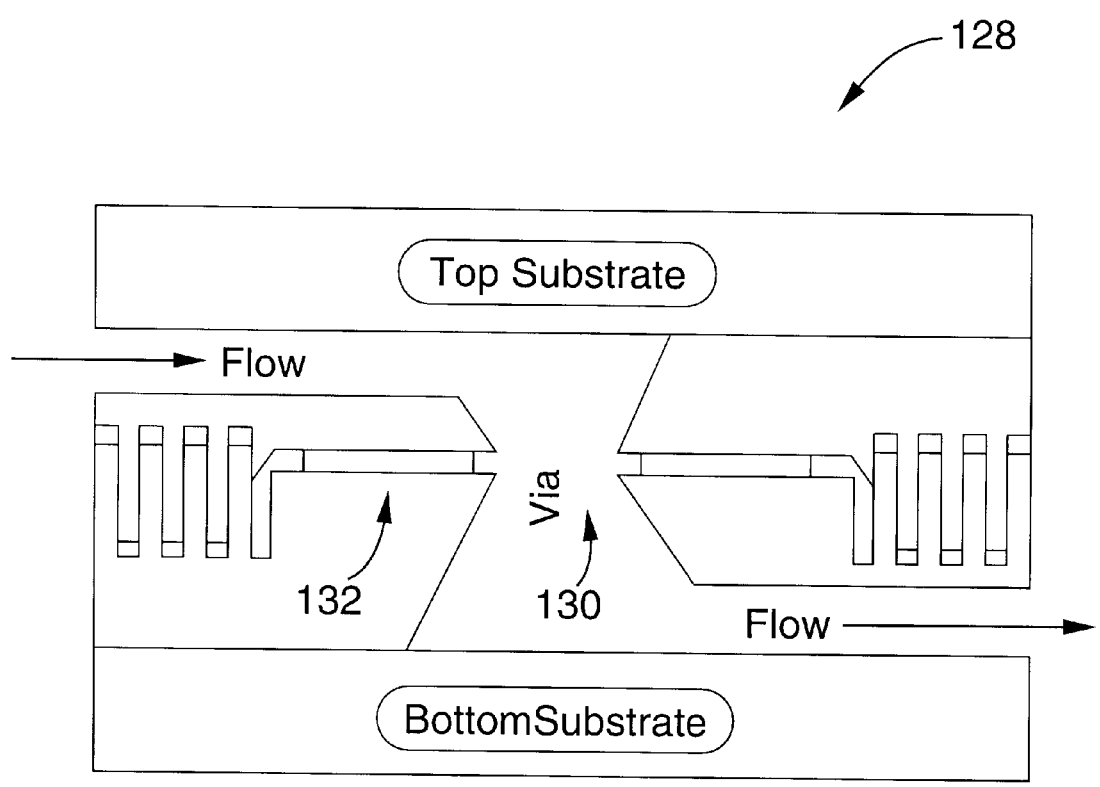
FIG. 27 is a front elevation diagrammatic view of a fluidic interconnect using finger MicroJoints in accordance with the present invention.

Referring to FIG. 27, a fluidic interconnect 128 was fabricated using finger MicroJoints. The interconnect was fabricated by a simple variation in the fabrication process shown in FIG. 12. Fluidic vias 130 connect flow channels etched into two substrates and a photo-patternable polysiloxane gasket 132 seals the via against leakage. The finger MicroJoints are press fit together and may be reversibly removed and reinserted if desired. When using silicon as the substrate material, the scourge of surface micromachining, stiction, aids in holding the substrates together until intentionally removed. In initial tests, silicon finger MicroJoints withstood over 30 psi (aqueous) without leakage. Gluing the finger joints together increases the strength of the joint and the maximum pressure the joint will withstand but at the expense of reversibility.

EXAMPLE 10

Figure 29:
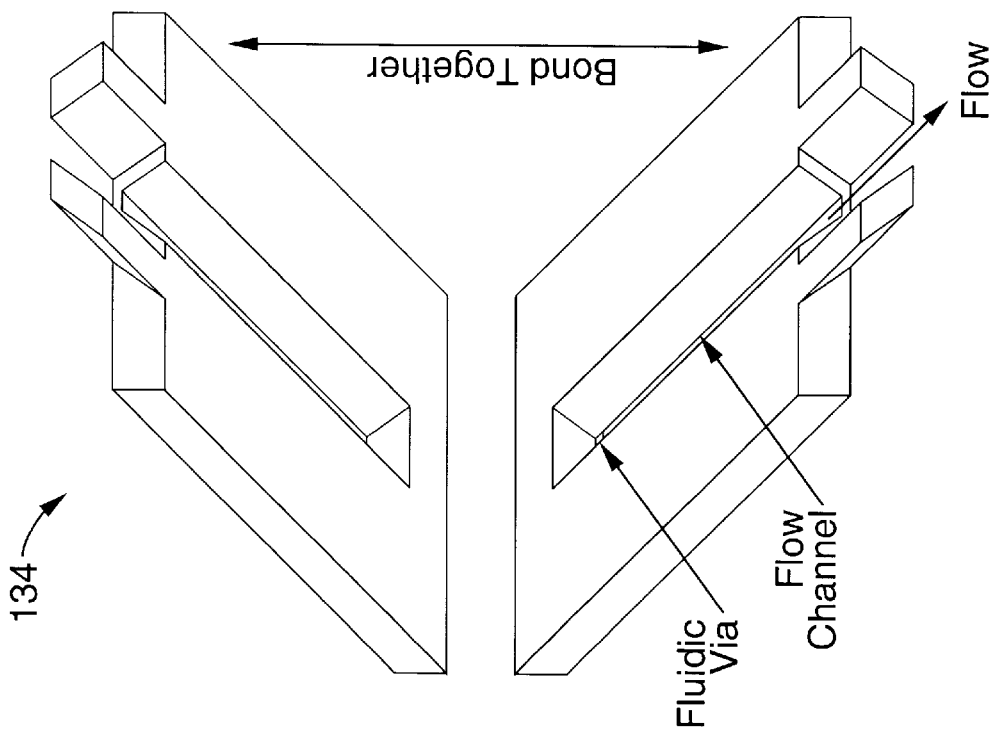
FIG. 29 is a exploded diagrammatic view of a mortise MicroJoint in accordance with the present invention fitted with a fluidic channel.
Figure 28:
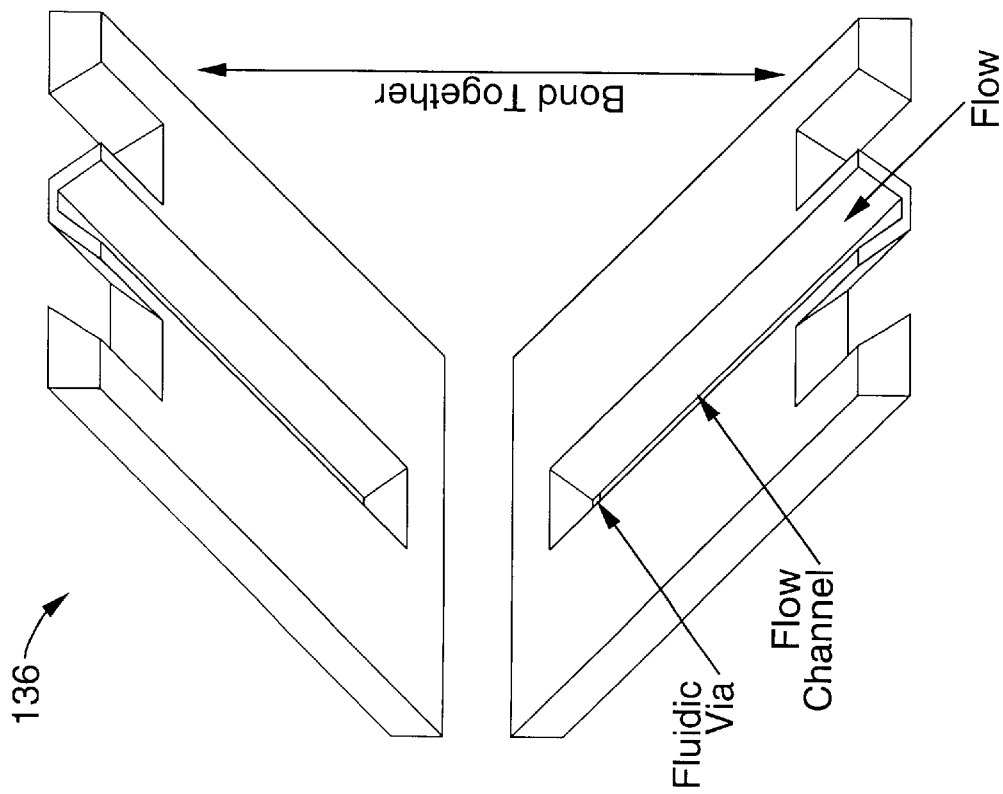
FIG. 28 is a exploded diagrammatic view of a tenon MicroJoint in accordance with the present invention fitted with a fluidic channel.

The primary use of the mortise and tenon MicroJoint to date is as a convenient fluidic "quick-connect" between two substrates. Fluidic microchannels and vias were etched into the mortise 134 and tenon 136 MicroJoints during the anisotropic etching step as shown in the exploded views of FIG. 28 and FIG. 29. Thin film elastomer gaskets such as polysiloxane were deposited at the ends of the MicroJoints to seal the "quick-connect". Finger MicroJoints and fluidic vias holes are also seen at the opposite ends of the "quick connect" to facilitate attachment to other fluidic modules.

One of the major problems associated with microfluidics is that eventually the microworld must interface with the macro world to either introduce or retrieve samples and/or reagents. Until now this has been an particularly troublesome problem for microfluidics (and MEMS generally). Typically, the preferred method to input reagents into a fluidic system is through the use of conventional tubing. Another variation on the mortise and tenon MicroJoint theme provides an ideal solution which addresses the problem of fluidic I/O. FIG. 30 shows a tenon MicroJoint with fluidic channel which has been modified to accept standard Tygon tubing (plasticized polyvinylchloride) 140. The OD of the hexagonal tenon (from flat to flat) is 700 µm and the ID of the tube is 762 µm (30 mils). The tubing was easily slipped over the silicon tenon and heated slightly to conform the tubing to the hexagonal dimensions of the tenon. The etched space 142 around the tubing was provided to guide and support the tubing against the stress on the silicon tenon. For most applications the configuration shown was sufficient to prevent breaking the silicon tenon. However, for more robust connections, the top and bottom was "capped" by fusion bonding or simply gluing additional silicon wafers to create a protected receiving cavity for the tubing.

EXAMPLE 11

Figure 32:
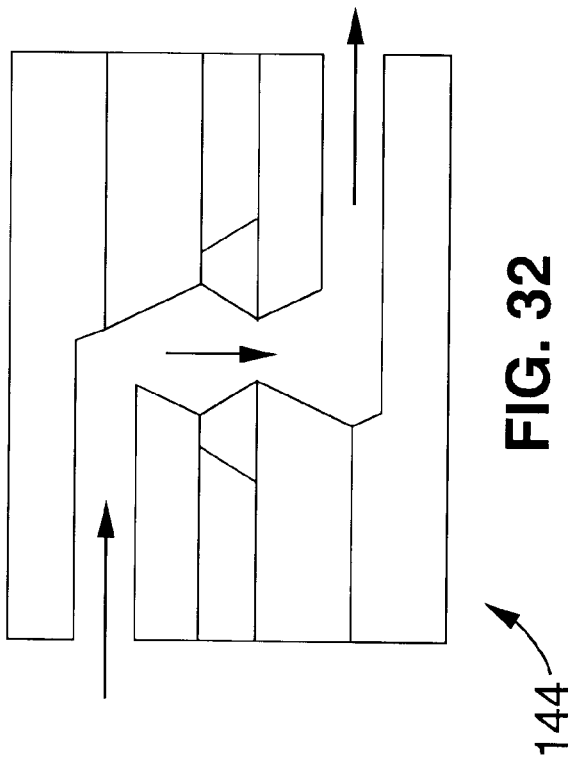
FIG. 32 is an assembled diagrammatic view of the fluidic interconnection/on/off valve shown in FIG. 31.
Figure 31:
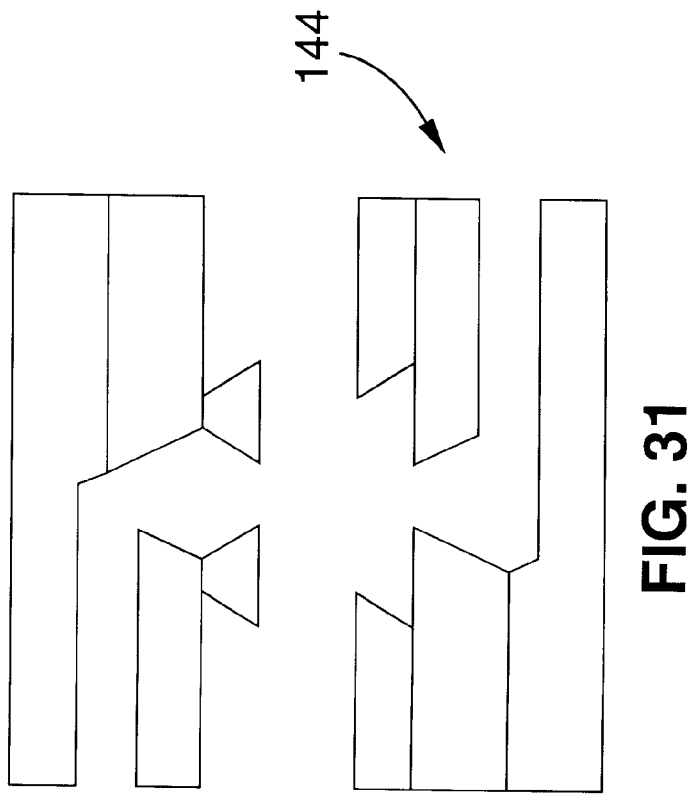
FIG. 31 is an exploded diagrammatic view of a fluidic interconnect/on/off valve using dovetail MicroJoints in accordance with the present invention.

FIG. 31 and FIG. 32 show a structure that can be used as a fluidic interconnect or an on/off valve 144.

EXAMPLE 12

Figure 33:
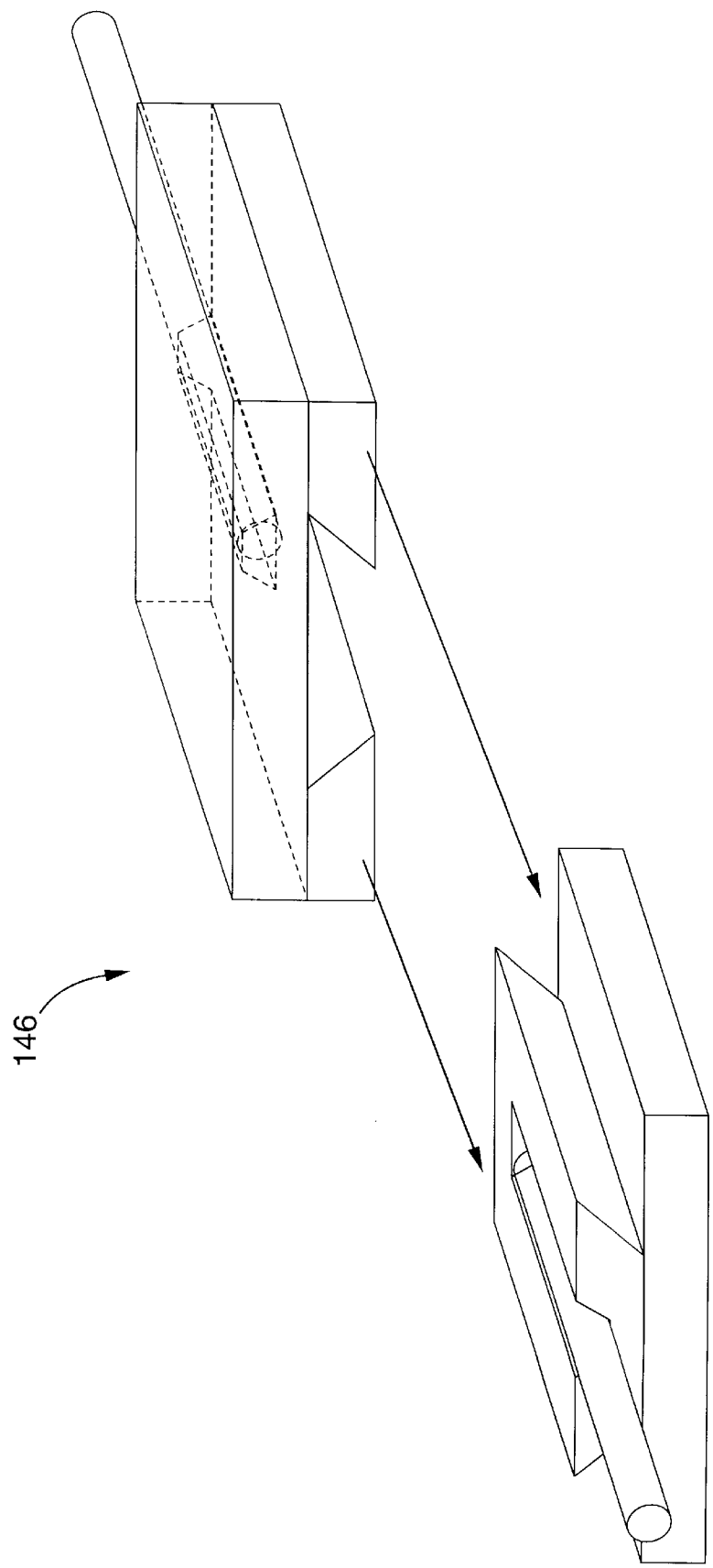
FIG. 33 is an exploded diagrammatic view of an optical fiber coupler using a dovetail MicroJoint in accordance with the present invention.

FIG. 33 shows an optical fiber coupler 146.

EXAMPLE 13

Figures 34C, 34D:
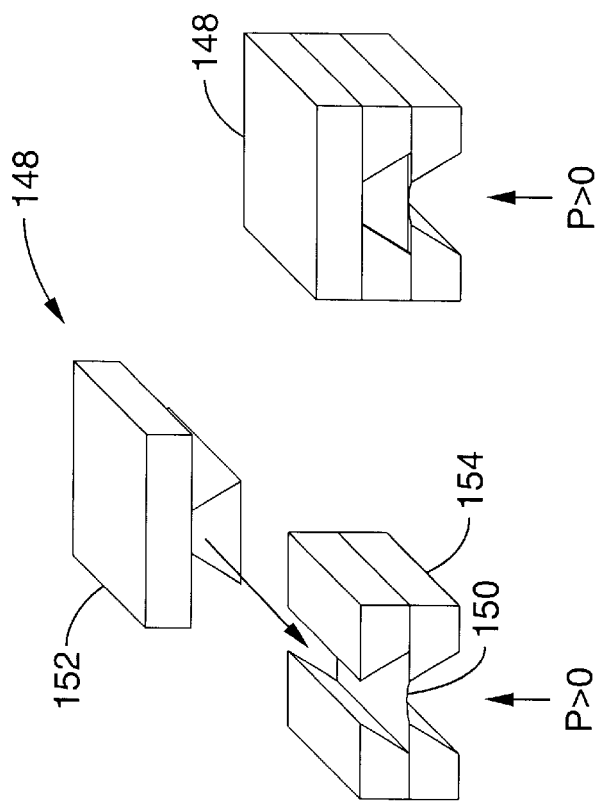
FIG. 34(a) through FIG. 34(d) are diagrammatic views of a membrane stop using a dovetail MicroJoint in accordance with the present invention.
Figures 34A, 34B:
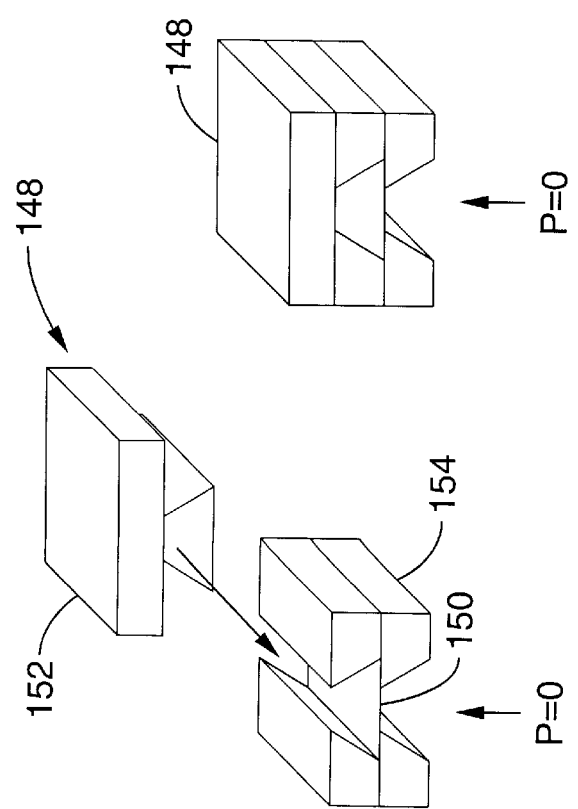

FIG. 34(a) through FIG. 34(d) show a membrane stop 148 for linear motion. In FIG. 34(a) and FIG. 34(b), the membrane 150 is relaxed under zero pressure, and the upper substrate 152 is free to pass over the lower substrate 152. In FIG. 34(c) and FIG. 34(d), the membrane deflects under pressure and the upper substrate cannot move.

EXAMPLE 14

Various microstructures were fabricated on four inch, (100) silicon wafers 500+/−30 µm thick and of varying resistivity. All anisotropic etching was performed in 22.5% KOH at 60° C. using a thermal oxide or CVD nitride as an etch mask. The mask was patterned by either standard photolithography or by cutting through the oxide and underlying silicon with a standard dicing saw. The saw was operated at spindle speeds between 15K and 20K rpm with a feed rate between 15 mils/sec and 120 mils/sec. Standard diamond coated nickel dicing blades or diamond impregnated resin dicing blades of 1–10 mil thickness were used throughout.

For fiber optic applications, multimode optical fibers were used. The optical source was a 7 mW HeNe laser and the optical power was measure by silicon pin photodiodes. The electrical output of the photodiodes was monitored by a dual channel digital oscilloscope. Optical power measurements for coupling efficiencies were made with an optical power meter calibrated to 6328 nm.

It is well known that silicon/silicon surfaces have a high affinity for each other and with time chemically bond causing stiction and seizing. Therefore, the bearing surfaces of the microstages described here were coated with a thin film of silicon nitride. This has two advantages: (i) silicon nitride is a hard material which resists wear, and (ii). silicon nitride is considerably less reactive than silicon. Although long term tests have not been performed, we have observed no stiction problems using silicon nitride. However, it is may be possible to improve switching times by reducing the frictional forces between the two stages through the use of CVD plasma TeflonTm or other friction reducing material.

Accordingly, it will be seen that this invention provides a method for constructing miniature integrated systems by utilizing traditional wood joining techniques that can be used to fabricate a multitude of components of miniature integrated systems. Although the description above contains many specificities, these should not be construed as limiting the scope of the invention but as merely providing illustrations of some of the presently preferred embodiments of this invention. Thus the scope of this invention should be determined by the appended claims and their legal equivalents.

What is claimed is:

1. A method of fabricating a microjoint, comprising:
   depositing and patterning an etch mask on a first (100) silicon wafer;
   anisotropically etching said first (100) silicon wafer to a desired depth;
   stripping said etch mask;
   bonding said first (100) silicon wafer to a second wafer to form a wafer assembly;
   thinning said first (100) silicon wafer to expose a microjoint element;
   dicing said wafer assembly to form complementary mechanically interlocking microjoint elements; and
   sliding said microjoint elements together until said microjoint elements interlock to form a microjoint that constrains movement between said microjoint elements.

2. A method as recited in claim 1:
   wherein said microjoint is non-permanent.

3. A method as recited in claim 1, wherein said microjoint is modular.

4. A method as recited in claim 1, wherein said microjoint is non-permanent and modular.

5. A method as recited in claim 1, wherein said second wafer comprises a silicon wafer.

6. A method as recited in claim 5, wherein said second wafer comprises a (100) silicon wafer.

7. A method of fabricating a microjoint, comprising:
   depositing and patterning an etch mask on a first silicon wafer;
   anisotropically etching said first silicon wafer to a desired depth;
   stripping said etch mask;
   bonding said first silicon wafer to a second wafer to form a wafer assembly;
   thinning said first silicon wafer to expose a microjoint element;
   dicing said wafer assembly to form complementary mechanically interlocking microjoint elements; and
   sliding said microjoint elements together until said microjoint elements interlock to form a microjoint that constrains movement between said microjoint elements.

8. A method as recited in claim 7:
   wherein said microjoint is non-permanent.

9. A method as recited in claim 7, wherein said microjoint is modular.

10. A method as recited in claim 7, wherein said microjoint is non-permanent and modular.

11. A method as recited in claim 7, wherein said second wafer comprises a silicon wafer.

12. A method as recited in claim 11, wherein said wafers comprise (100) silicon wafers.

* * * * *